(12) United States Patent
Cheng et al.

(10) Patent No.: US 12,068,363 B2
(45) Date of Patent: Aug. 20, 2024

(54) STRUCTURE FORMATION IN A SEMICONDUCTOR DEVICE

(71) Applicant: Taiwan Semiconductor Manufacturing Company, Ltd., Hsinchu (TW)

(72) Inventors: Kuang-Wei Cheng, Hsinchu (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 258 days.

(21) Appl. No.: 17/444,026

(22) Filed: Jul. 29, 2021

(65) Prior Publication Data

US 2023/0036572 A1 Feb. 2, 2023

(51) Int. Cl.
*H01L 21/768* (2006.01)
*H01L 23/48* (2006.01)
*H01L 49/02* (2006.01)

(52) U.S. Cl.
CPC ........ *H01L 28/91* (2013.01); *H01L 21/76832* (2013.01); *H01L 21/76898* (2013.01); *H01L 23/481* (2013.01)

(58) Field of Classification Search
CPC ............... H01L 28/91; H01L 21/76832; H01L 21/76898; H01L 23/481; H01L 21/76831; H01L 21/76802
See application file for complete search history.

(56) References Cited

U.S. PATENT DOCUMENTS

| 8,816,491 | B2 | 8/2014 | Chen et al. | |
|---|---|---|---|---|
| 2011/0193226 | A1* | 8/2011 | Kirby | H01L 23/481 257/E21.585 |
| 2015/0028494 | A1* | 1/2015 | Park | H01L 21/76831 257/774 |
| 2017/0053872 | A1* | 2/2017 | Lee | H01L 21/76879 |

* cited by examiner

*Primary Examiner* — Herve-Louis Y Assouman
(74) *Attorney, Agent, or Firm* — Harrity & Harrity, LLP

(57) ABSTRACT

A semiconductor device may include one or more low dielectric constant (low-κ) layers on a substrate. The semiconductor device may include a dielectric layer on the one or more low-κ layers. The semiconductor device may include a structure through the substrate, the one or more low-κ layers, and the dielectric layer. The semiconductor device may include a liner layer between the structure and the substrate, between the structure and the one or more low-κ layers, and between the structure and the dielectric layer. The semiconductor device may include a capping layer between the liner layer and the dielectric layer and between the liner layer and the one or more low-κ layers.

20 Claims, 23 Drawing Sheets

300

STRUCTURE FORMATION IN A SEMICONDUCTOR DEVICE

BACKGROUND

A semiconductor device may include a structure that is formed at least partially through a substrate of the semiconductor device (e.g., such that the structure extends at least partially through the substrate). The structure can be a through-silicon via (TSV) or a deep trench capacitor (DTC) formed at least partially through the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
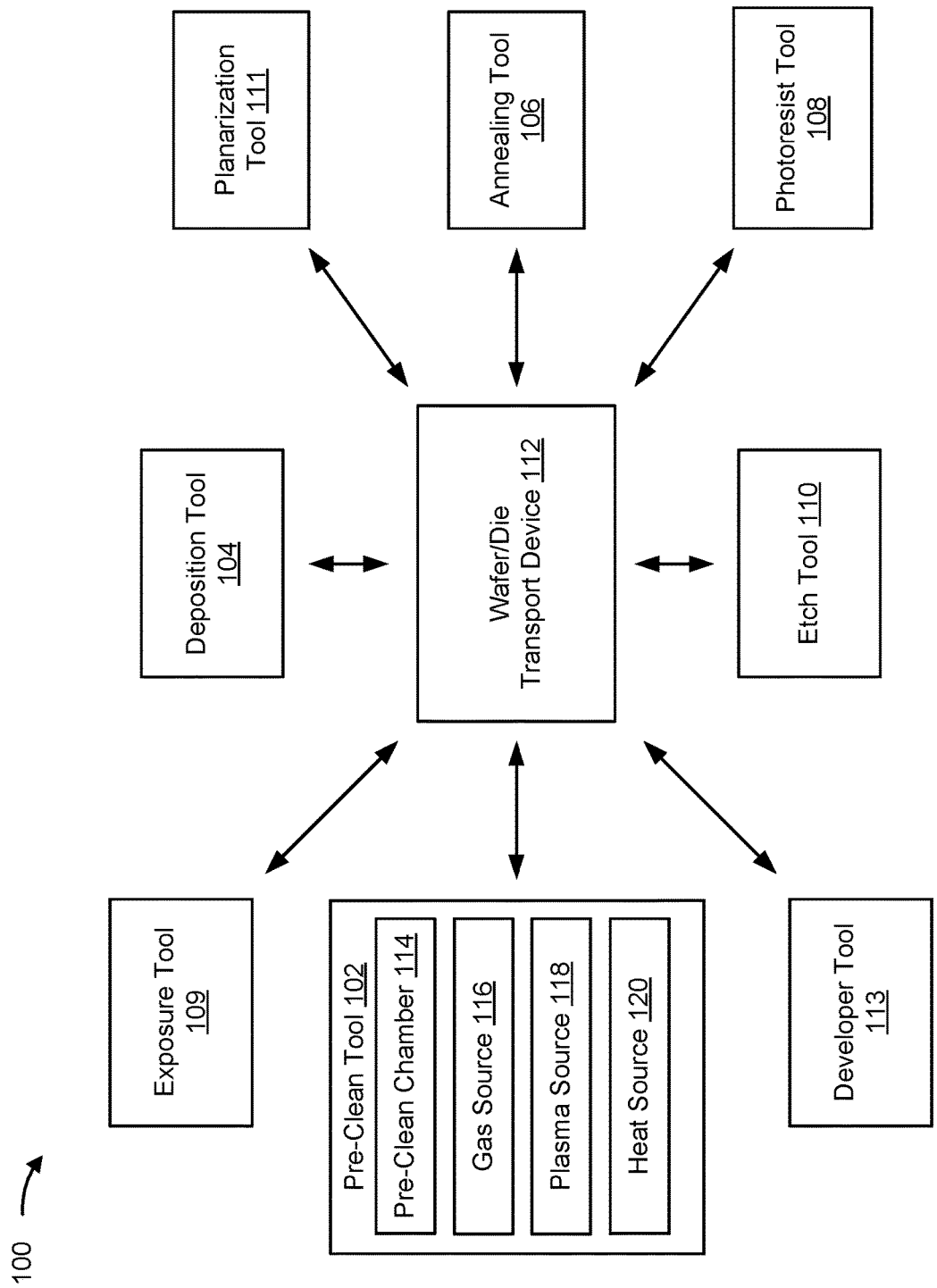
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor device may include a structure that extends at least partially through a substrate of the semiconductor device. Such a structure may be a TSV (e.g., a vertical electrical connection that passes through a silicon wafer or die of a semiconductor device), a DTC (e.g., a device used to add capacitance to an integrated circuit), or another type of structure. For the example, the semiconductor device may include one or more dielectric layers, such as one or more layers comprising, for example, SiN, $SiO_2$, SiON, AlO, AlN, SiCN, SiOC, or the like, a composite film including a set of low-κ layers (e.g., a set of layers formed from a material with a low dielectric constant relative to that of silicon dioxide), and a substrate (e.g., a silicon substrate). Generally, an opening for the structure is formed through the one or more dielectric layers and the set of low-κ layers, and at least partially through the substrate. Next, a liner layer (e.g., a silicon dioxide layer) is deposited on at least sidewalls of the opening. The liner layer is deposited directly on exposed surfaces of the one or more dielectric layers, exposed surfaces of the set of low-κ layers, and exposed surfaces of the substrate. The structure can then be formed over the liner layer within the opening.

The low-κ characteristic of the set of low-κ layers is a result of the low-κ material having voids that act to reduce the dielectric constant (e.g., by formation of silicon-carbon bonds). However, oxide radicals provided during deposition of the liner layer can destroy some of these voids (e.g., by breaking the silicon-carbon bonds as a result of formation of silicon-oxygen-silicon bonds), thereby causing damage to one or more of the low-κ layers. Put another way, the deposition of the liner layer may result in oxidation of one or more of the low-κ layers, meaning that the deposition of the liner layer can damage the one or more low-κ layers. This damage degrades performance of the semiconductor device, a result of which can significantly reduce yield when manufacturing semiconductor devices that include structures such as TSVs, DTCs, and/or the like.

Some implementations described herein provide techniques and apparatuses for formation of a structure without damaging a low-κ layer. In some implementations, a semiconductor device includes a set of low-κ layers on a substrate, one or more dielectric layers, and a structure through the substrate, the set of low-κ layers. In some implementations, the semiconductor device includes a liner layer between the structure and the substrate, between the structure and the set of low-κ layers, and between the structure and the one or more dielectric layers. In some implementations, the semiconductor device includes a capping layer between the liner layer and the one or more dielectric layers and between the liner layer and the set of low-κ layers. Here, the capping layer is formed to prevent damage to the set of low-κ layers during deposition of the liner layer. Further details regarding such a semiconductor device are provided below, followed by example processes for fabricating such a semiconductor device.

In some implementations, the capping layer acts to prevent damage to the set of low-κ layers that would otherwise be caused by the deposition of the liner layer. The capping layer may be, for example, a silicon nitride layer or a silicon carbonitride layer. During fabrication, the capping layer prevents the liner layer from being deposited directly on exposed surfaces of the set of low-κ layers, thereby preventing damage to the set of low-κ layers during the deposition of the liner layer. By preventing the liner layer from being deposited directly on the exposed surfaces of the set of low-κ layers, the capping layer prevents damage to the set of low-κ layers that could otherwise be caused by oxidation during the deposition of the liner layer. Therefore, performance of the semiconductor device is not impacted due to low-κ layer damage that would have otherwise been caused by deposition of the liner layer directly on the set of low-κ layers, which can significantly improve yield when manufacturing semiconductor devices that include structures such as TSVs, DTCs, and/or the like.

FIG. 1 is a diagram of an example environment 100 in which systems and/or methods described herein may be implemented. As shown in FIG. 1, environment 100 may include a pre-clean tool 102, a deposition tool 104, an annealing tool 106, a photoresist tool 108, an exposure tool 109, an etch tool 110, a planarization tool 111, a wafer/die transport device 112, and a developer tool 113. The tools and/or devices included in example environment 100 may be included in a semiconductor clean room, a semiconductor foundry, a semiconductor processing and/or manufacturing facility, and/or the like.

Pre-clean tool 102 includes a pre-clean chamber 114 and one or more devices capable of performing a pre-clean process on a semiconductor device to remove a byproduct layer from the semiconductor device. The one or more devices may include a gas source 116, a plasma source 118, a heat source 120, and/or the like. Gas source 116 may supply various gasses to pre-clean chamber 114, such as an ammonia gas, a nitrogen trifluoride gas, and/or the like. Plasma source 118 may generate a plasma that causes a reaction between the gasses supplied to pre-clean chamber 114. For example, plasma source 118 may include an inductively coupled plasma (ICP) source, transformer coupled plasma (TCP) source, or another type of plasma source capable of causing a reaction between an ammonia gas and a nitrogen trifluoride gas to cause the formation of an ammonium fluoride gas. Heat source 120 may be capable of heating a semiconductor device in pre-clean chamber 114 to cause one or more layers on the semiconductor device to decompose, as described herein. For example, heat source 120 may include a heat lamp, a heating coil, or another type of heating device that heats the semiconductor device to cause an ammonium fluoride layer on the semiconductor device to decompose into an ammonia gas and a hydrogen fluoride gas, as described herein.

Deposition tool 104 is a semiconductor processing tool that includes a semiconductor processing chamber and one or more devices capable of depositing various types of materials onto a semiconductor device. For example, deposition tool 104 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), an atomic layer deposition (ALD) device, a plasma-enhanced ALD (PEALD) device, an ion implantation device, a plating device, and/or the like. A plating device includes one or more devices capable of plating a substrate (e.g., a wafer, a semiconductor device, and/or the like) or a portion thereof with one or more metals. For example, a plating device may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or the like. Plating, and particularly electroplating (or electro-chemical deposition), is a process by which conductive structures are formed on a substrate (e.g., a semiconductor wafer, a semiconductor device, and/or the like). Plating may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material ions into trenches, vias, interconnects, and/or other structures in and/or on the substrate. In some implementations, deposition tool 104 may perform one or more operations related to deposition of one or more layers in association with formation of a structure without damage to a low-κ layer, as described herein.

Annealing tool 106 is a semiconductor processing tool that includes a semiconductor processing chamber and one or more devices capable of heating a semiconductor device. For example, annealing tool 106 may include a rapid thermal annealing (RTA) tool or another type of annealing tool that is capable of heating a semiconductor device to cause a reaction between two or more materials or gasses, to cause a material to decompose, and/or the like. For example, annealing tool 106 may heat a semiconductor device to cause a metal layer on an epitaxial region (e.g., a source region or a drain region) to react and form a metal silicide layer, as described herein.

Photoresist tool 108 is a semiconductor processing tool that removes materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. Photoresist tool 108 may coat the semiconductor device with a photo-sensitive organic material, and may apply a patterned mask to the semiconductor device to block light, so that only unmasked regions of the photo-sensitive organic material will be exposed to light. Photoresist tool 108 or another tool (e.g., etch tool 110) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed. In some implementations, photoresist tool 108 may perform one or more operations related to forming an opening in association with formation of a structure without damage to a low-κ layer, as described herein.

Exposure tool 109 includes one or more devices capable of exposing a photoresist layer to a radiation source, such as a UV source (e.g., a deep UV light source, an extreme UV light source, and/or the like), an x-ray source, and/or the like. Exposure tool 109 may expose the photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device or substrate, and/or the like. In some implementations, exposure tool 109 includes a scanner, a stepper, or a similar type of exposure device.

Etch tool 110 is a semiconductor processing tool that removes materials from a surface of a semiconductor device. In some implementations, a portion of the semiconductor device is protected from an etchant by a masking material that resists etching. For example, the masking material may include a photoresist that is patterned using photolithography. Etch tool 110 may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.01 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetra fluorine may be utilized to etch silicon and chlorine may be utilized to etch aluminum, trifluoro methane may be used to etch silicon dioxide and silicon nitride, and/or the like. The plasma may also include oxygen that is used to oxidize photoresist and facilitate removal of the photoresist. In some implementations, etch tool 110 may perform one or more operations related to forming an opening in association with formation of a structure without damage to a low-κ layer, as described herein.

Planarization tool 111 is a semiconductor processing tool that planarizes or polishes a surface of a semiconductor device (e.g., a layer, a substrate, a wafer, and/or the like). In some implementations, planarization tool 111 may perform planarizing or polishing using a chemical mechanical polishing/planarization (CMP) process. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the wafer is rotated. The polishing pad may also be rotated to ensure a continuous supply of slurry is applied to the polishing pad.

Wafer/die transport device 112 includes a mobile robot, a robot arm, a tram or rail car, and/or another type of device that are used to transport wafers and/or dies between semiconductor processing tools 102-110 and/or to and from other locations, such as a wafer rack, a storage room, and/or the like. In some implementations, wafer/die transport device 112 may be a programmed device to travel a particular path and/or may operate semi-autonomously or autonomously.

Developer tool 113 includes one or more devices capable of developing a photoresist layer that has been exposed to a radiation source to develop a pattern transferred to the photoresist layer from exposure tool 109 (e.g., a stepper, a scanner, or another type of exposure device). In some implementations, developer tool 113 develops a pattern by removing unexposed portions of a photoresist layer. In some implementations, developer tool 113 develops a pattern by removing exposed portions of a photoresist layer. In some implementations, developer tool 113 develops a pattern by dissolving exposed or unexposed portions of a photoresist layer through the use of a chemical developer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
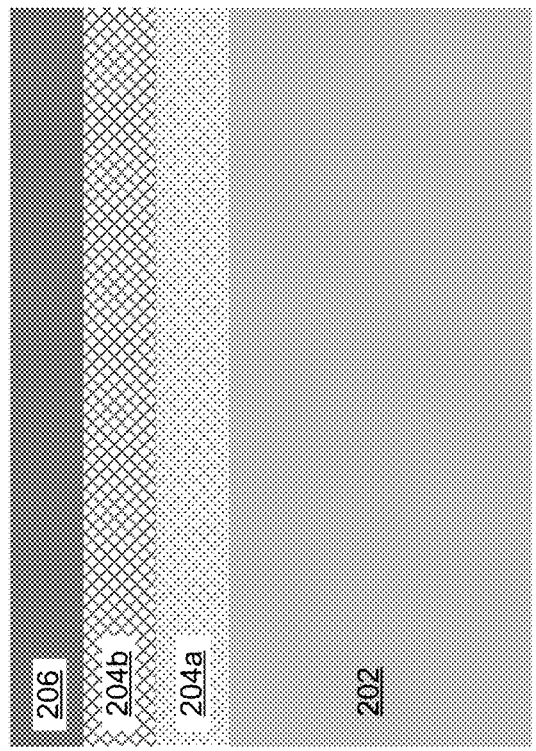
FIGS. 2A-2K are diagrams of a first example sequence of operations for manufacturing a semiconductor device comprising a capping layer associated with preventing damage to a set of low-κ layers described herein.

FIGS. 2A-2K are diagrams of a first example sequence of operations for manufacturing a semiconductor device comprising a capping layer associated with preventing damage to one or more low-κ layers. As shown in FIG. 2A, a semiconductor device 200 may include a substrate 202, one or more of low-κ layers 204 (e.g., low-κ layers 204a and 204b are shown as being included in semiconductor device 200), and a dielectric layer 206. Semiconductor device 200 may include a semiconductor wafer, a semiconductor die, and/or the like.

Substrate 202 may include a silicon wafer sliced from a silicon crystal ingot grown as a cylinder. Substrate 202 may have an electrical conductivity value falling between that of a conductor, such as metallic copper, and an insulator, such as glass. In some implementations, substrate 202 may comprise another material, such as germanium, gallium arsenide, silicon germanium, and/or the like.

Low-κ layer 204 may include a layer to isolate elements of semiconductor device 200. For example, in some implementations, a low-κ layer 204 is an insulating dielectric that separates conducting elements (e.g., wire interconnects, transistors, and/or the like) of semiconductor device 200 from one another. In some implementations, a low-κ material may be utilized in semiconductor device 200 to enable scaling of microelectronic devices on semiconductor device 200. In some implementations, low-κ layer 204 has a low dielectric constant relative to that of silicon dioxide. For example, a material from which low-κ layer 204 is formed may have a dielectric constant that is less than 4.2. In some implementations, semiconductor device 200 may include one or more low-κ layers 204 (e.g., low-κ layers 204a and 204b). In some implementations, deposition tool 104 of environment 100, described above in connection with FIG. 1, may be utilized to form one or more low-κ layers 204. As an example, deposition tool 104 may be utilized to form low-κ layer 204a on a top surface of substrate 202, and may then be utilized to form low-κ layer 204b on a top surface of low-κ layer 204a. In some implementations, deposition tool 104 may perform a plasma-enhanced chemical vapor deposition (PECVD) process, a high density plasma CVD (HDPCVD) process, a sub-atmospheric CVD (SACVD) process, an ALD process, a PEALD process, and/or the like to deposit a given low-κ layer 204.

Dielectric layer 206 may include one or more layers comprising one or more dielectric materials (e.g., SiN, $SiO_2$, SiON, AlO, AlN, SiCN, SiOC, or the like). In some implementations, dielectric layer 206 may serve to protect or isolate elements of semiconductor device 200. Dielectric layer 206 may be utilized as an insulator and passivation layer in multilevel interlevel dielectric devices. In some implementations, deposition tool 104 of environment 100, described above in connection with FIG. 1, may be utilized to form dielectric layer 206 on a top surface of a low-κ layer 204 (e.g., a top surface of low-κ layer 204b). In some implementations, deposition tool 104 may perform a PECVD process, an HDPCVD process, an SACVD process, and/or the like to deposit dielectric layer 206 on the top surface of the low-κ layer 204.

Figure 2B:
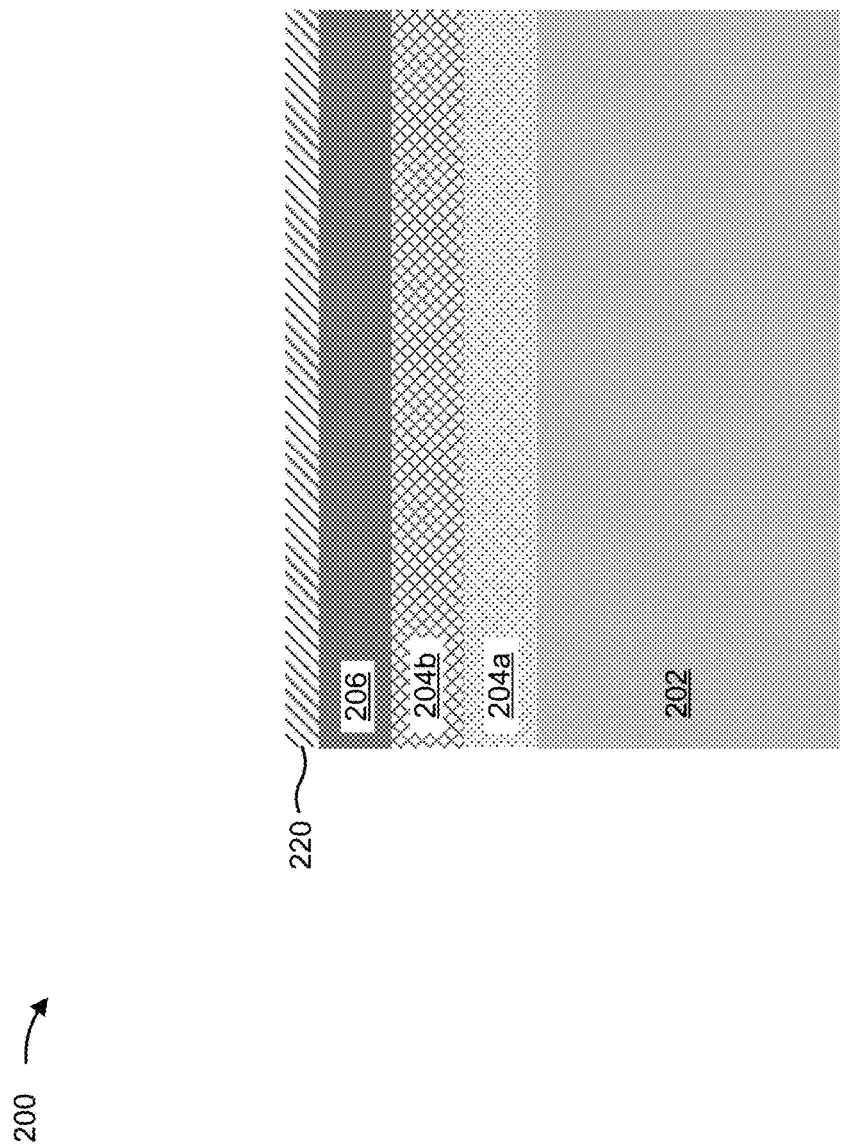
Figure 2C:
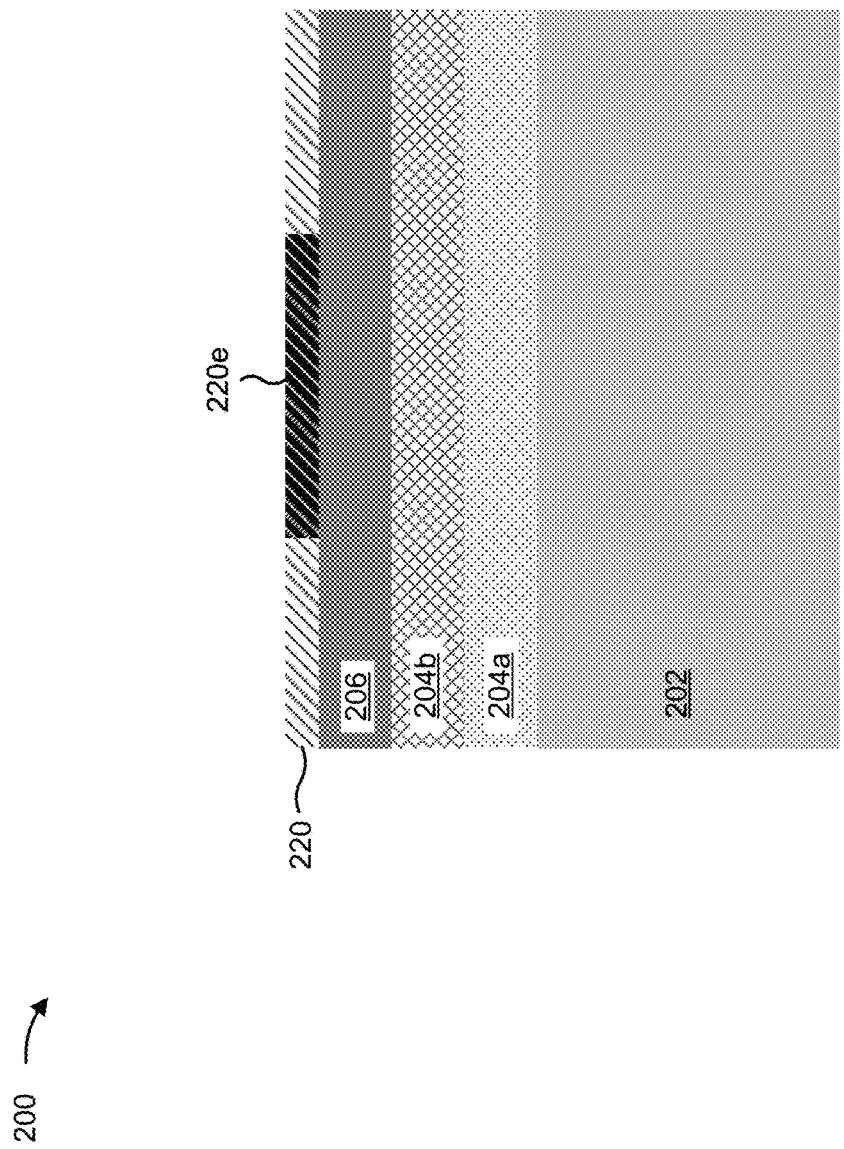

As shown in FIG. 2B, a photoresist layer 220 may be formed on dielectric layer 206. For example, a semiconductor processing tool (e.g., photoresist tool 108) may form photoresist layer 220 on dielectric layer 206 by a spin coating process or another type of coating process. As shown in FIG. 2C, photoresist layer 220 may be exposed to a radiation source to transfer a pattern from a photomask to photoresist layer 220. For example, a semiconductor processing tool (e.g., exposure tool 109) may expose photoresist layer 220 to a radiation source to transfer a pattern from a photomask to photoresist layer 220. In these cases, the semiconductor processing tool may expose (or may refrain from exposing, depending on the type of photoresist and exposure process) portion 220e of photoresist layer 220 in an area where an opening is to be formed through the one or more low-κ layers 204, and substrate 202.

Figure 2D:
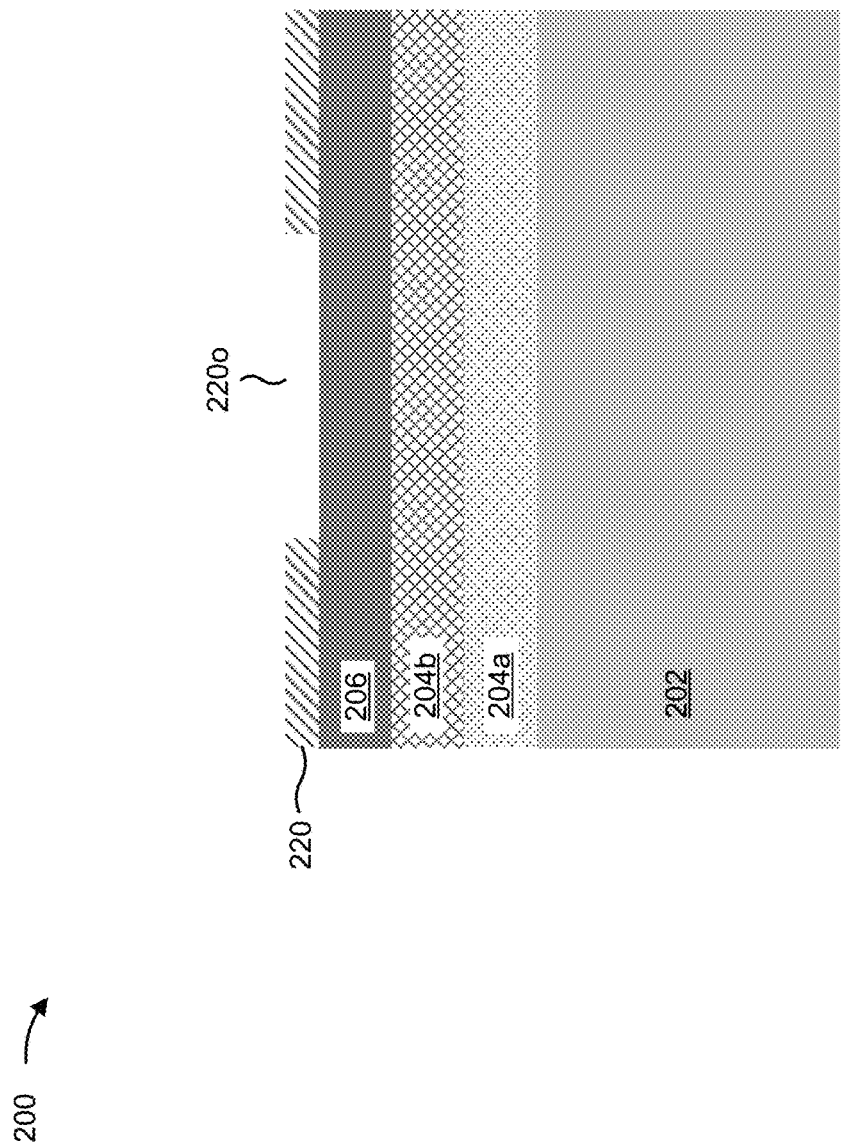

As shown in FIG. 2D, a semiconductor processing tool (e.g., developer tool 113) may develop photoresist layer 220 by removing the exposed (or unexposed) portion 220e from dielectric layer 206. In some implementations, the semiconductor processing tool develops the photoresist layer 220 by dissolving the exposed or unexposed portion 220e of photoresist layer 220 through the use of a chemical developer. With the portion 220e removed, an opening 220o is formed through photoresist layer 220. The opening 220o through photoresist layer 220 forms a pattern for forming opening 208 through the one or more low-κ layers 204, and substrate 202.

Figure 2E:
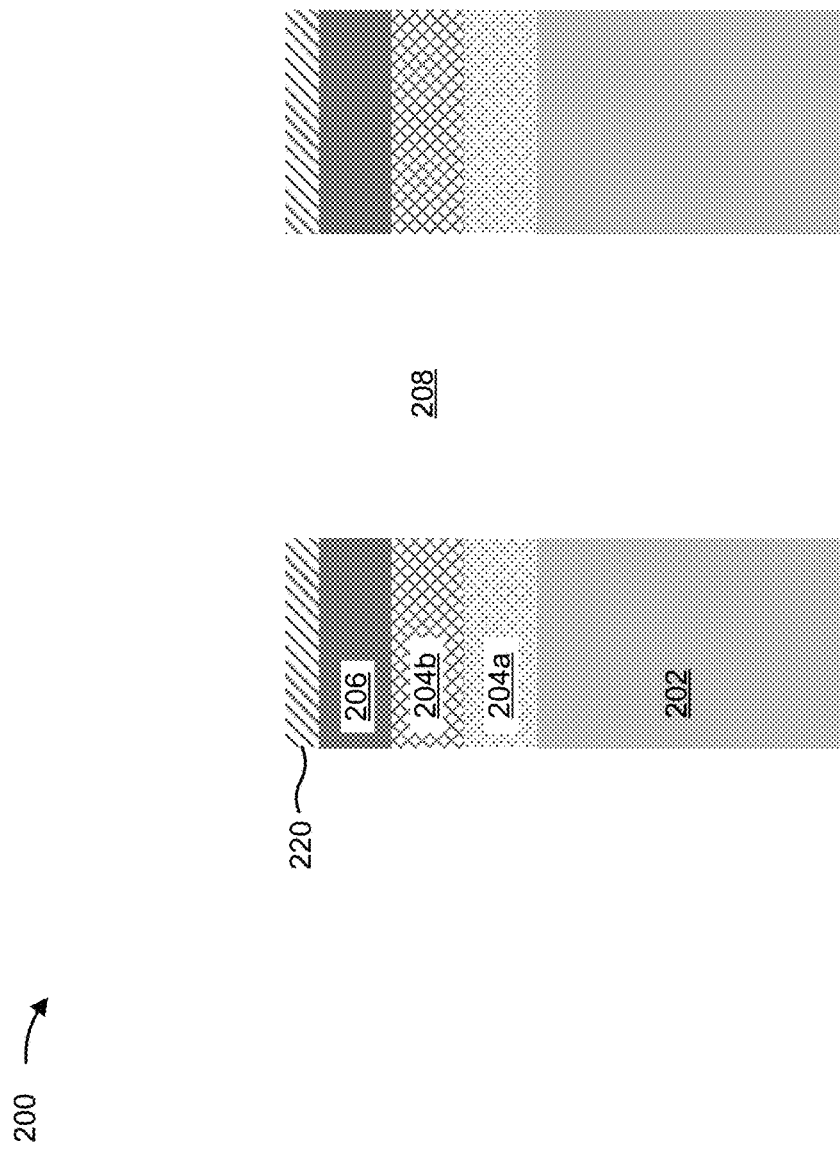

As shown in FIG. 2E, a semiconductor processing tool (e.g., etching tool 110) may etch dielectric layer 206, the one or more low-κ layers 204, and substrate 202 using the pattern formed in photoresist layer 220. For example, the semiconductor processing tool may perform a wet etching technique, a dry etching technique, or another type of etching technique to remove portions of dielectric layer 206, the one or more low-κ layers 204, and substrate 202 where opening 220o was formed in photoresist layer 220. Removing the portions of dielectric layer 206, the one or more low-κ layers 204, and substrate 202 forms opening 208.

Figure 2F:
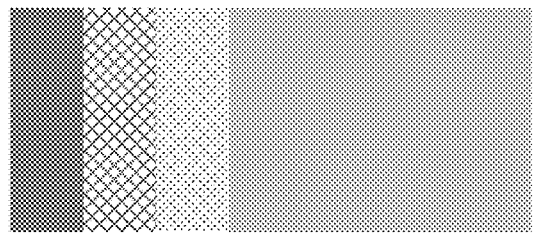
Figure 2F:
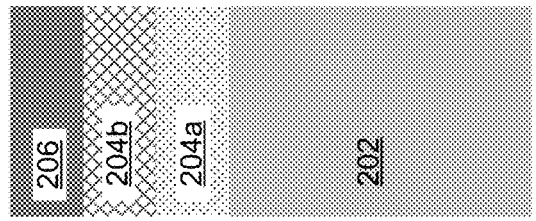

As shown in FIG. 2F, the remaining portions of photoresist layer 220 may be removed from dielectric layer 206. In some implementations, opening 208 may extend through at least dielectric layer 206 and the one or more low-κ layers 204. In some implementations, opening 208 may extend at least partially through substrate 202. For example, as shown in FIG. 2F, opening 208 may extend through substrate 202 in semiconductor device 200. Notably, after formation of opening 208, surfaces of the one or more low-κ layers 204 are exposed within opening 208. In some implementations, a size of opening 208 may taper along a depth of opening 208 to facilitate deposition of a capping layer 210 and a liner layer 212 on the sidewalls of opening 208, as described below. In some implementations, photoresist tool 108 and/or etch tool 110 of environment 100, described above in connection with FIG. 1, may be utilized to form opening 208.

Figure 2G:
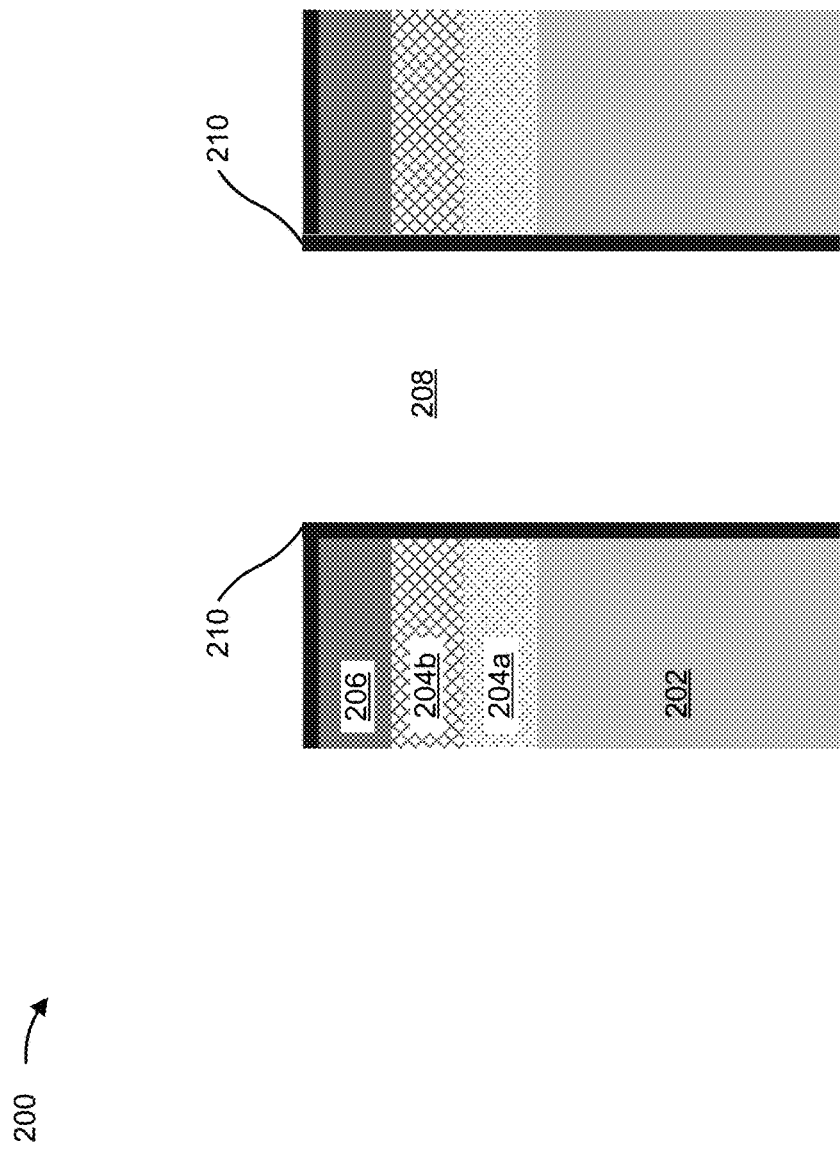

As shown in FIG. 2G, a capping layer 210 may be deposited on at least the sidewalls of opening 208. For example, capping layer 210 may be deposited on the sidewalls of opening 208 and on a top surface of dielectric layer 206. Capping layer 210 includes a layer to prevent a liner layer 212 from being deposited on exposed surfaces of the one or more low-κ layers 204 within opening 208 (e.g., such that capping layer 210 prevents oxidation of the one or more low-κ layers 204 during the deposition of liner layer 212). As shown in FIG. 2G, capping layer 210 may be deposited such that capping layer 210 covers at least the exposed surfaces of the one or more low-κ layers 204 within opening 208. For example, capping layer 210 may be deposited such that capping layer 210 covers the exposed surfaces of the one or more low-κ layers 204 in opening 208, as well as exposed surfaces of dielectric layer 206 in opening 208 and exposed surfaces of substrate 202 in opening 208. In some implementations, deposition tool 104 may perform a PECVD process, an HDPCVD process, an SACVD process, an ALD process, a PEALD process, and/or the like to deposit capping layer 210 on the sidewalls of opening 208.

In some implementations, capping layer 210 comprises silicon nitride, silicon carbonitride, silicon carbide, amorphous silicon, a combination thereof, and/or the like. In some implementations, an oxygen concentration of capping layer 210 is less than approximately 5%. In some implementations, a thickness of capping layer 210 is in a range from approximately 50 Angstroms (Å) to approximately 1000 Å. In some implementations, the thickness of capping layer 210 is approximately 10% to approximately 100% of a thickness of liner layer 212. In some implementations, the thickness of capping layer 210 may vary along a depth of opening 208. For example, a thickness of capping layer 210 near a top surface of dielectric layer 206 may be approximately 30% to approximately 100% of a thickness of capping layer 210 near a bottom surface of a bottom low-κ layer 204 of the one or more low-κ layers 204.

Figure 2H:
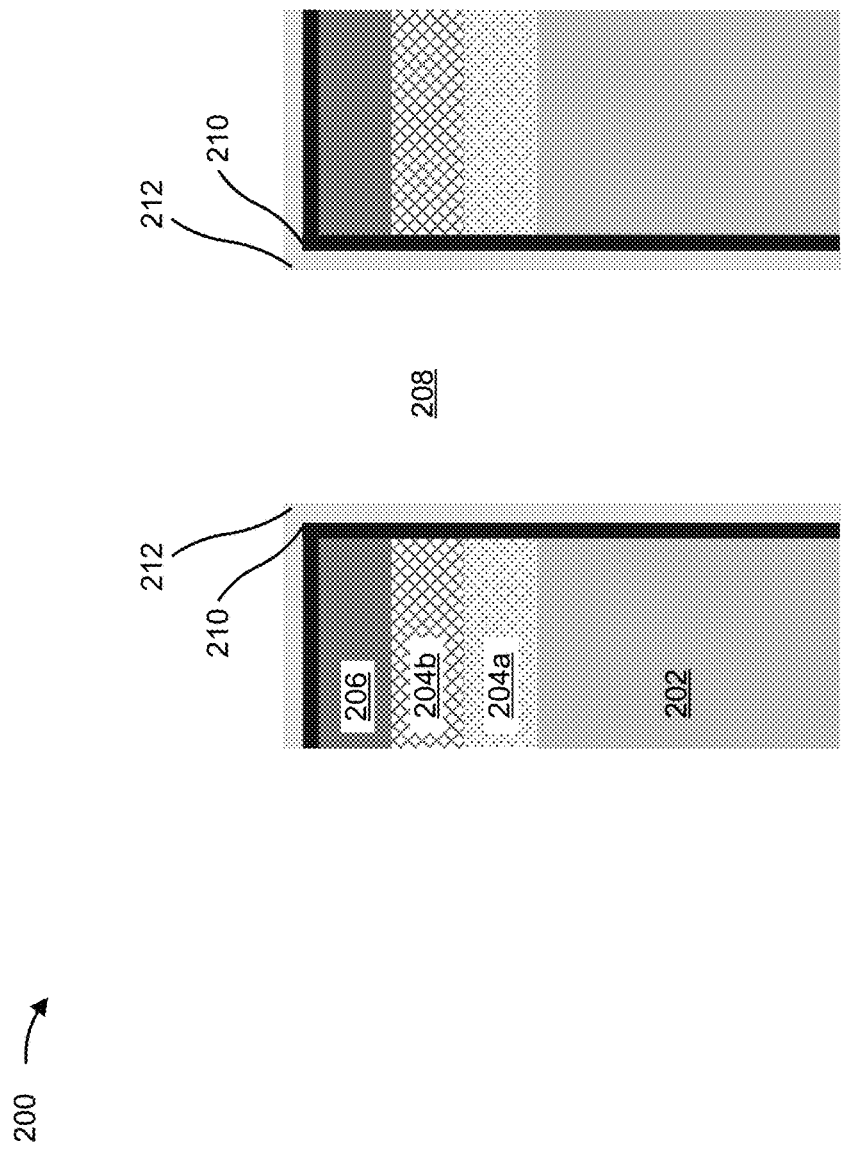

As shown in FIG. 2H, liner layer 212 may be deposited over capping layer 210. Liner layer 212 includes a layer to provide electrical insulation of structure 214 from one or more other layers of semiconductor device 200 (e.g., substrate 202). In some implementations, capping layer 210 prevents liner layer 212 from being deposited on the exposed surfaces of the one or more low-κ layers 204 within opening 208. As noted above, capping layer 210 prevents liner layer 212 from being deposited on exposed surfaces of the one or more low-κ layers 204 within opening 208, thereby preventing oxidation of the one or more low-κ layers 204 during the deposition of liner layer 212. In some implementations, deposition tool 104 may perform a PECVD process, an HDPCVD process, an SACVD process, an ALD process, a PEALD process, and/or the like to deposit liner layer 212 on capping layer 210.

In some implementations, liner layer 212 comprises silicon dioxide. In some implementations, a thickness of liner layer 212 is in a range from approximately 500 Å to approximately 12000 Å. In some implementations, the thickness of liner layer 212 may vary along a depth of opening 208. For example, a thickness of liner layer 212 near a top surface of dielectric layer 206 may be approximately 30% to approximately 100% of a thickness of liner layer 212 near a bottom surface of a bottom low-κ layer 204 of the one or more low-κ layers 204.

Figure 2I:
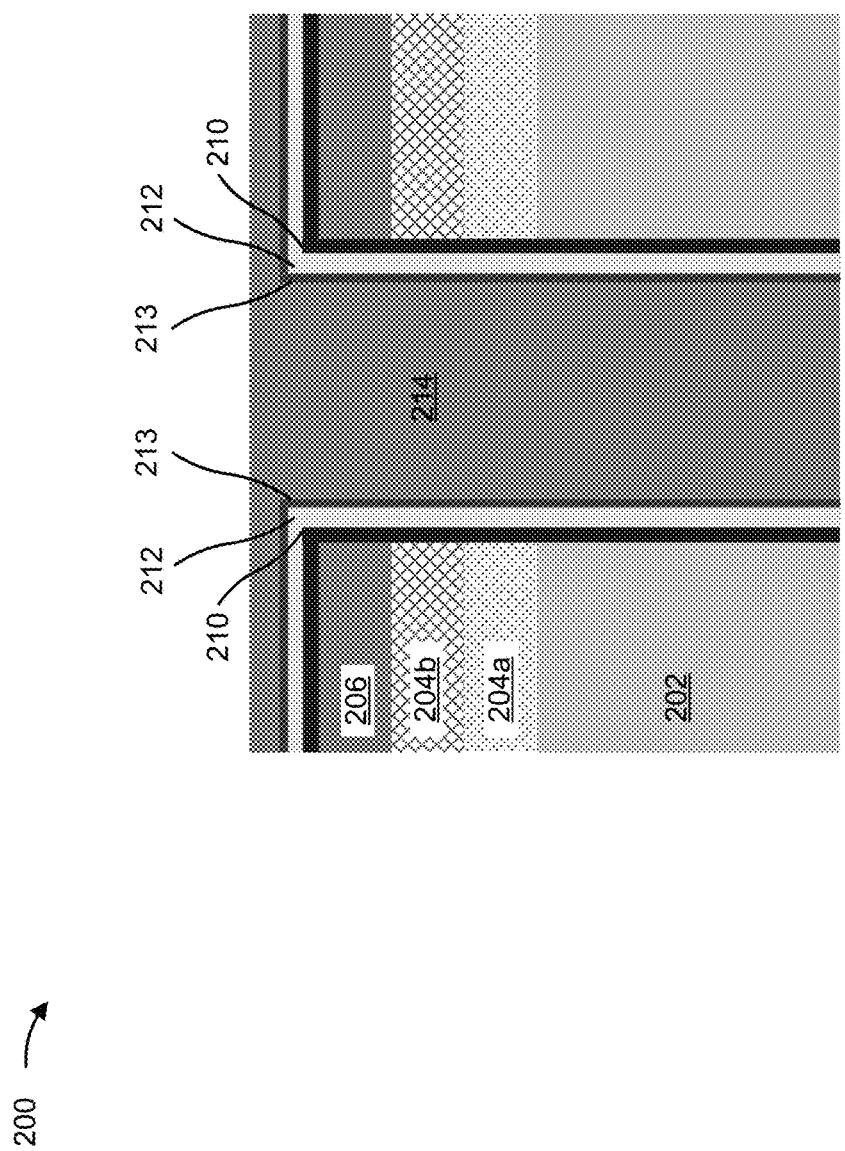

As shown in FIG. 2I, a structure 214 may be formed on liner layer 212 within opening 208. In some implementations, a semiconductor processing tool (e.g., deposition tool 104) may form structure 214. For example, in some implementations, the semiconductor processing tool deposits (e.g., using a physical vapor deposition process, a chemical vapor deposition process, and/or the like) barrier layer 213 on liner layer 212 and a seed layer on barrier layer 213. Barrier layer 213 is to prevent a later-formed conductive material from diffusing into other layers of semiconductor device 200 (e.g., to prevent damage caused by the conductive material), while the seed layer is a layer to improve adhesion of the conductive material of structure 214. Next, the semiconductor processing tool performs an electroplating (e.g., electro-chemical deposition) process to provide the conductive material of structure 214 in opening 208 (e.g., on barrier layer 213 or the seed layer). When performing the electroplating process, the semiconductor processing tool applies a voltage across an anode formed of a plating material and a cathode (e.g., substrate 202). The voltage causes a current to oxidize the anode, which causes the release of plating material ions from the anode. These plating material ions form a plating solution that travels through a plating bath toward substrate 202. The plating solution reaches the substrate 202 and deposits plating material ions into opening 208 to form structure 214. In some implementations, structure 214 may be a TSV, as shown in semiconductor device 200. Alternatively, in some implementations, structure 214 may be DTC, or another type of structure that extends at least partially through substrate 202 of semiconductor device 200.

Figure 2J:
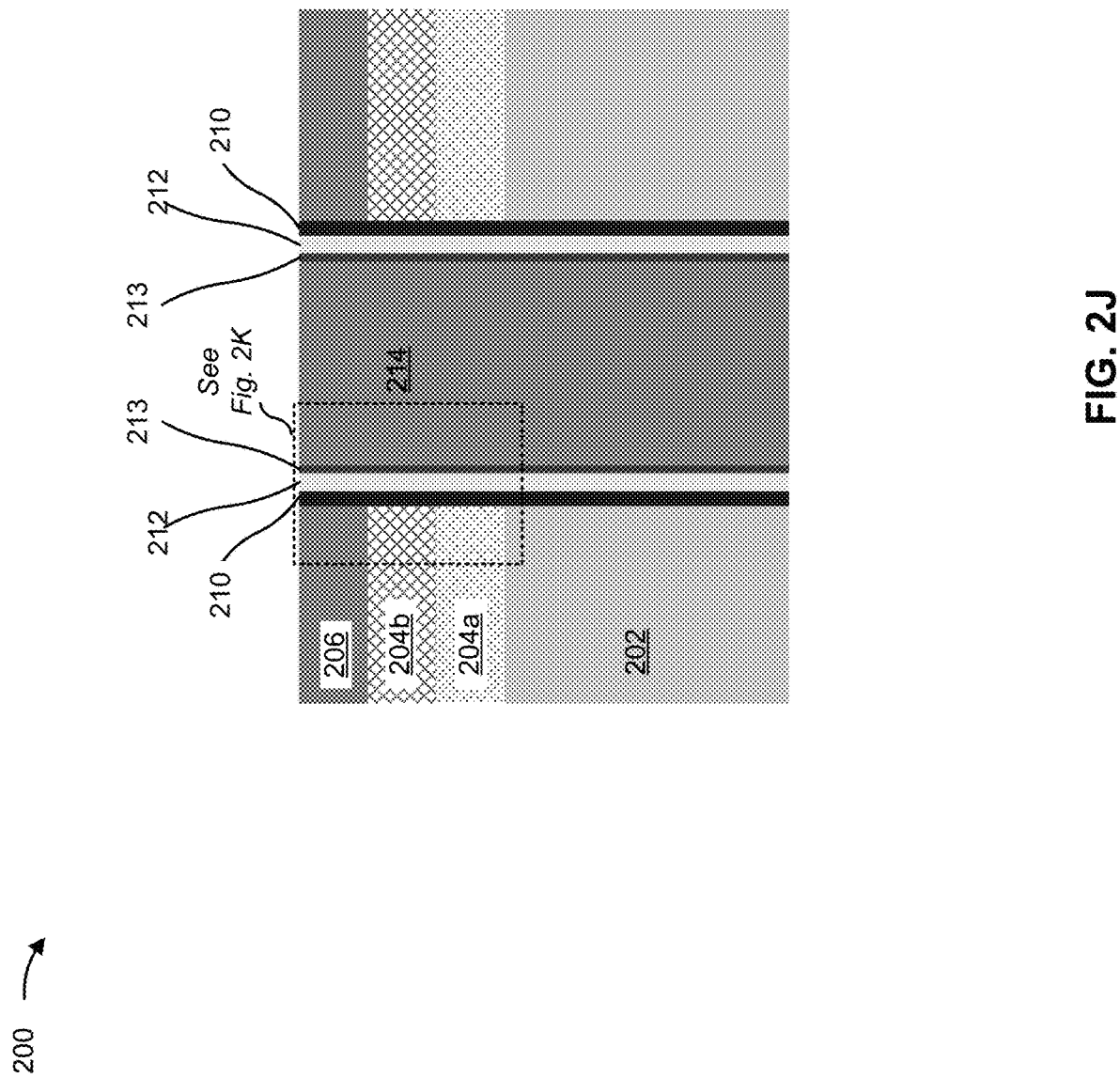

As shown in FIG. 2J, portions of structure 214, liner layer 212, and capping layer 210 may be removed from a top surface of dielectric layer 206 (e.g., such that the top surface of dielectric layer 206 is exposed). In some implementations, the portions of structure 214, liner layer 212, and capping layer 210 may be removed from the top surface of dielectric layer 206 using a planarization technique (e.g., a CMP technique) to remove these portions and flatten the top surface of semiconductor device 200. In some implementations, a semiconductor processing tool (e.g., planarization tool 111) may perform a CMP process to remove the portions of structure 214, liner layer 212, and capping layer 210 from the top surface of dielectric layer 206.

As a result of the process described in association with FIGS. 2A-2J, semiconductor device 200 includes the one or more low-κ layers 204 on substrate 202, dielectric layer 206 on the one or more low-κ layers 204, and structure 214 through substrate 202, the one or more low-κ layers 204, and dielectric layer 206. As further shown, semiconductor device 200 includes liner layer 212 between structure 214 and substrate 202, between structure 214 and the one or more low-κ layers 204, and between structure 214 and dielectric layer 206. As shown, semiconductor device 200 also includes capping layer 210 between liner layer 212 and dielectric layer 206, between liner layer 212 and the one or more low-κ layers 204, and between liner layer 212 and substrate 202.

Figure 2K:
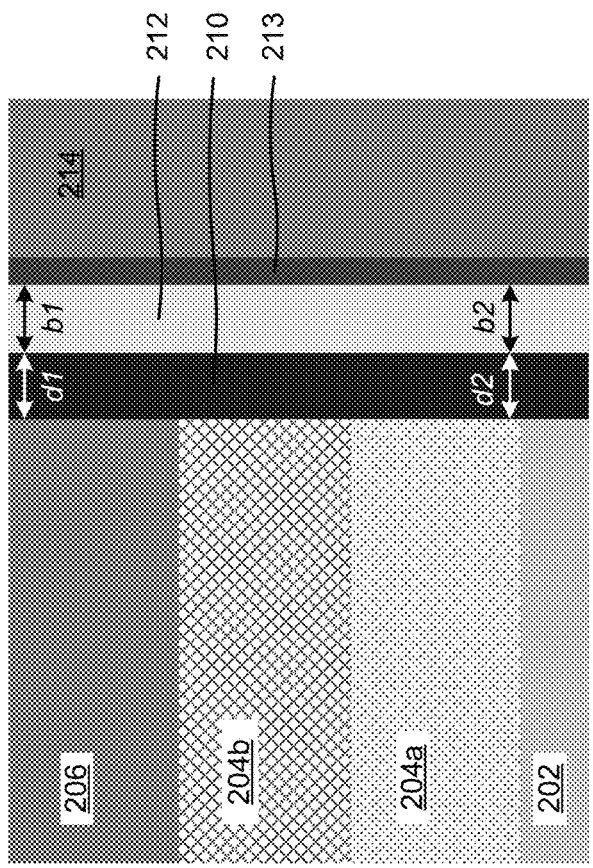

In some implementations, the thickness of capping layer 210 and/or the thickness of liner layer 212 may vary along a depth of opening 208 in semiconductor device 200. FIG. 2K illustrates such variation in the thicknesses of capping layer 210 and liner layer 212 in semiconductor device 200. With reference to FIG. 2K, a thickness d1 of capping layer 210 (e.g., a thickness of capping layer 210 near a top surface of dielectric layer 206) may be approximately 30% to approximately 100% of a thickness d2 of capping layer 210 in semiconductor device 200 (e.g., a thickness of capping layer 210 near a bottom surface of low-κ layer 204a). Similarly, a thickness b1 of liner layer 212 (e.g., a thickness of liner layer 212 near a top surface of dielectric layer 206) may be approximately 30% to approximately 100% of a thickness b2 of liner layer 212 in semiconductor device 200 (e.g., a thickness of liner layer 212 near a bottom surface of low-κ layer 204a)

As indicated above, FIGS. 2A-2K are provided as examples. Other examples may differ from what is described with regard to FIGS. 2A-2K.

Figure 3A:
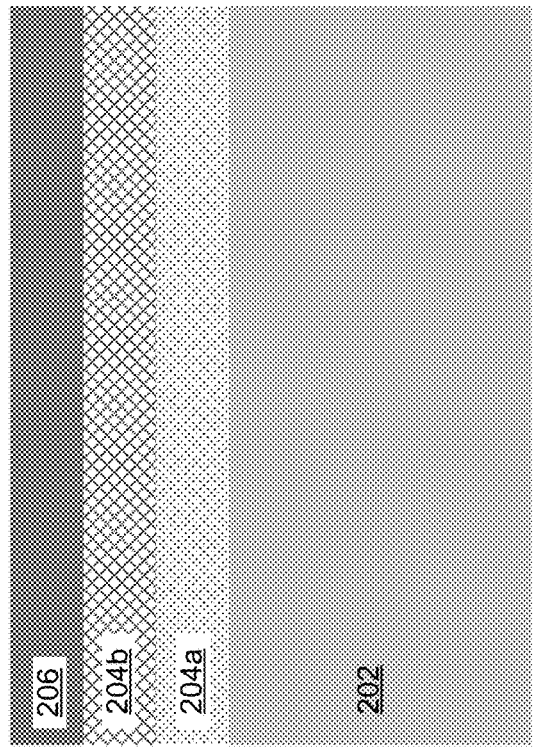
FIGS. 3A-3H are diagrams of a second example sequence of operations for manufacturing a semiconductor device comprising a capping layer associated with preventing damage to a set of low-κ layers described herein.
Figure 3A:

FIGS. 3A-3H are diagrams of a second example sequence of operations for manufacturing a semiconductor device comprising a capping layer associated with preventing damage to one or more low-κ layers. As shown in FIG. 3A, semiconductor device 300 may include a substrate 202, one or more low-κ layers 204 (e.g., low-κ layers 204a and 204b are shown as being included in semiconductor device 300), and a dielectric layer 206. Semiconductor device 300 may include a semiconductor wafer, a semiconductor die, and/or the like. Substrate 202, low-κ layers 204, and dielectric layer 206 may have characteristics and may be formed as described above in association with semiconductor device 200.

Figure 3B:
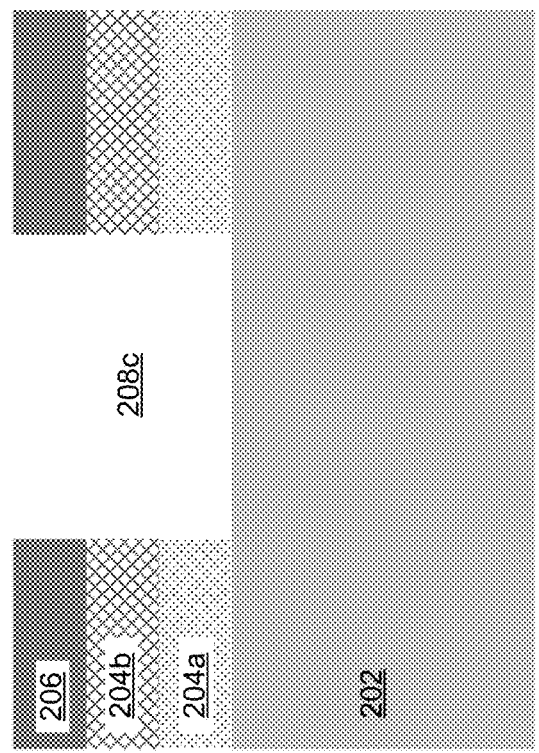

As shown in FIG. 3B, an opening 208c may be formed through dielectric layer 206 and the one or more low-κ layers 204. For example, a semiconductor processing tool (e.g., one or more of the semiconductor processing tools illustrated and described above in connection with FIG. 1) forms opening 208c through dielectric layer 206 and the one or more low-κ layers 204. The formation of opening 208c may be performed in a similar manner as the formation of opening 208 in semiconductor device 200, as described above with respect to FIGS. 2B-2F. That is, a semiconductor processing tool may form photoresist layer 220 on dielectric layer 206, a semiconductor processing tool may expose photoresist layer 220 to a radiation source to pattern photoresist layer 220, a semiconductor processing tool may develop and remove a portion 220e of photoresist layer 220 to expose the pattern, a semiconductor processing tool may etch dielectric layer 206 and the one or more low-κ layers 204 to form opening 208c, and a semiconductor processing tool may remove the remaining portions of photoresist layer 220 after etching of dielectric layer 206 and the one or more low-κ layers 204 (e.g., using a chemical stripper and/or another technique). In some implementations, opening 208c does not extend into substrate 202. For example, as shown in FIG. 3B, opening 208c may extend through dielectric layer 206 and the one or more low-κ layers 204, but may not extend into substrate 202 in semiconductor device 300. In some implementations, opening 208c extends partially into substrate 202. Notably, after formation of opening 208c, surfaces of the one or more low-κ layers 204 are exposed within opening 208c. In some implementations, a size of opening 208c may taper along a depth of opening 208c to facilitate deposition of a capping layer 210 and a liner layer 212 on the sidewalls of opening 208c, as described below.

Figure 3C:
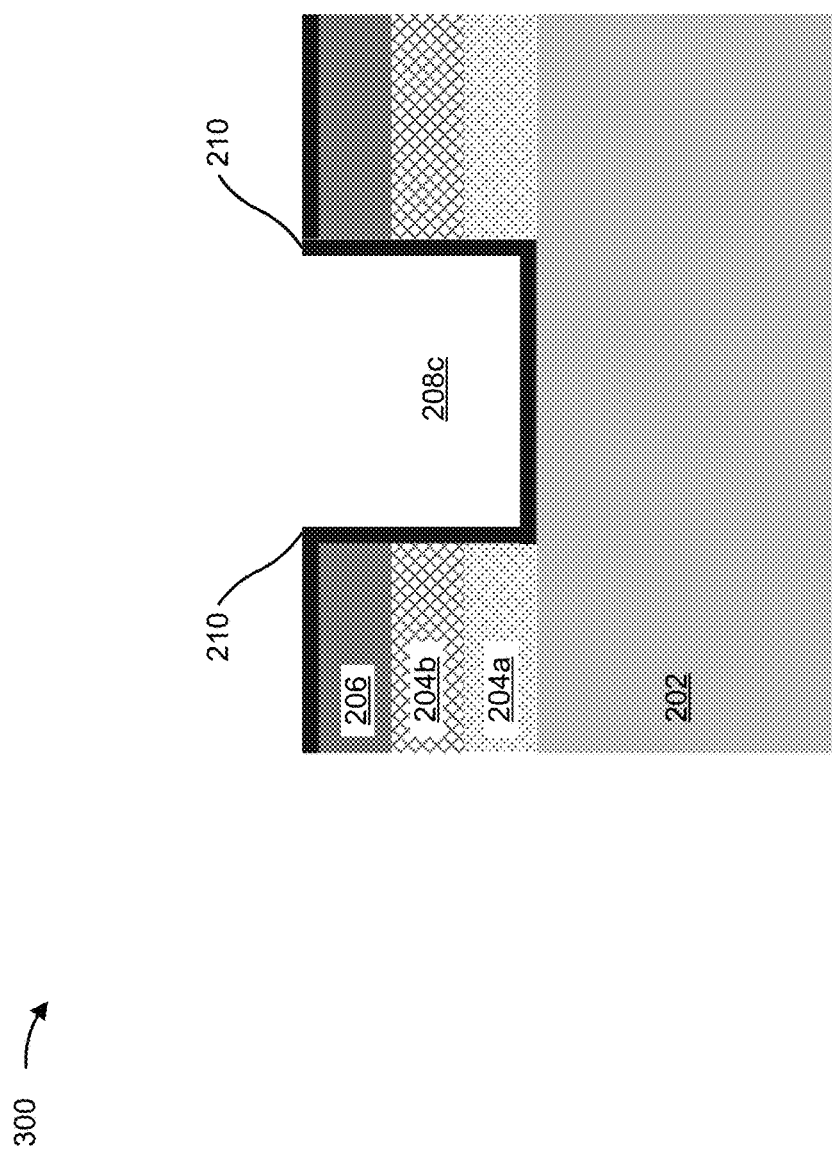

As shown in FIG. 3C, capping layer 210 may be deposited on at least the sidewalls of opening 208c. For example, capping layer 210 may be deposited on the sidewalls of opening 208c, on a top surface of dielectric layer 206, and on bottom surface of opening 208c (e.g., a top surface of substrate 202). Capping layer 210 may have characteristics and may be formed as described above in association with semiconductor device 200. As shown in FIG. 3C, capping layer 210 may be deposited such that capping layer 210 covers at least the exposed surfaces of the one or more low-κ layers 204 within opening 208c. For example, capping layer 210 may be deposited such that capping layer 210 covers the exposed surfaces of the one or more low-κ layers 204 in opening 208c, as well as exposed surfaces of dielectric layer 206 in opening 208c. In some implementations, deposition tool 104 may perform a PECVD process, an HDPCVD process, an SACVD process, and/or the like to deposit capping layer 210 on the sidewalls of opening 208c.

Figure 3D:
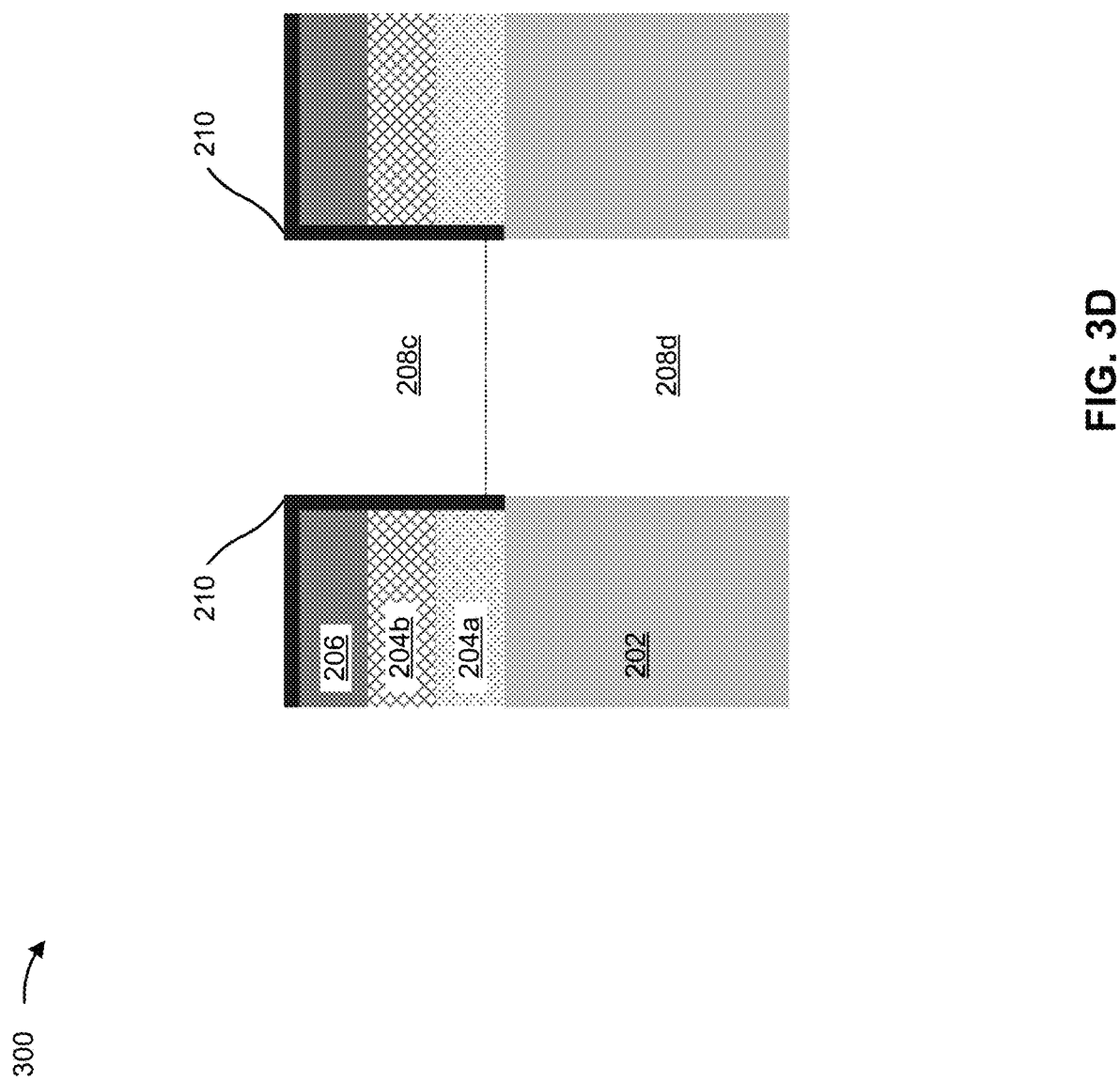

As shown in FIG. 3D, an opening 208d may be formed through substrate 202. That is, opening 208c may be extended such that opening 208c and opening 208d form an opening 208 that is through substrate 202. For example, a semiconductor processing tool (e.g., one or more of the semiconductor processing tools illustrated and described above in connection with FIG. 1) forms opening 208d through substrate 202. The formation of opening 208c may be performed in a similar manner as the formation of opening 208 in semiconductor device 200, as described above with respect to FIGS. 2B-2F. That is, a semiconductor processing tool may form photoresist layer 220 on capping layer 210 and substrate 202, a semiconductor processing tool may expose photoresist layer 220 to a radiation source to pattern photoresist layer 220, a semiconductor processing tool may develop and remove a portion 220e of photoresist layer 220 to expose the pattern, a semiconductor processing tool may etch capping layer 210 and substrate 202 to form opening 208d, and a semiconductor processing tool may remove the remaining portions of photoresist layer 220 after etching of substrate 202 (e.g., using a chemical stripper and/or another technique). In some implementations, a size of opening 208d may taper along a depth of opening 208d to facilitate deposition of liner layer 212 on the sidewalls of opening 208d, as described below.

Figure 3E:
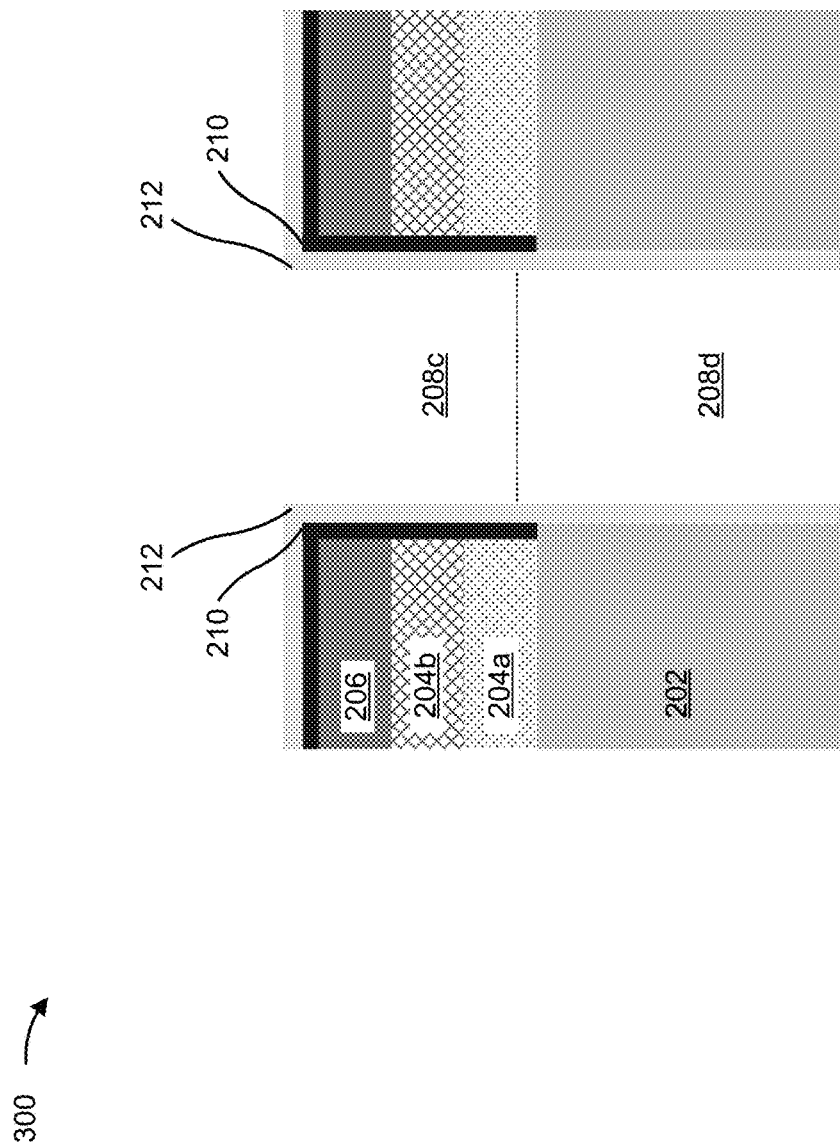

As shown in FIG. 3E, liner layer 212 may be deposited over at least capping layer 210. Liner layer 212 may have characteristics and may be formed as described above in association with semiconductor device 200. However, because capping layer 210 is deposited before surfaces of substrate 202 are exposed, liner layer 212 is formed on the exposed surfaces of substrate 202 in semiconductor device 300 (e.g., as compared to semiconductor device 200 in which capping layer 210 is formed on exposed surfaces of substrate 202). In some implementations, capping layer 210 prevents liner layer 212 from being deposited on the exposed surfaces of the one or more low-κ layers 204 within opening 208c. As noted above, capping layer 210 prevents liner layer 212 from being deposited on exposed surfaces of the one or more low-κ layers 204 within opening 208c, thereby preventing oxidation of the one or more low-κ layers 204 during the deposition of liner layer 212c. In some implementations, deposition tool 104 may perform a PECVD process, an HDPCVD process, an SACVD process, an ALD process, a PEALD process, and/or the like to deposit liner layer 212 on capping layer 210.

Figure 3F:
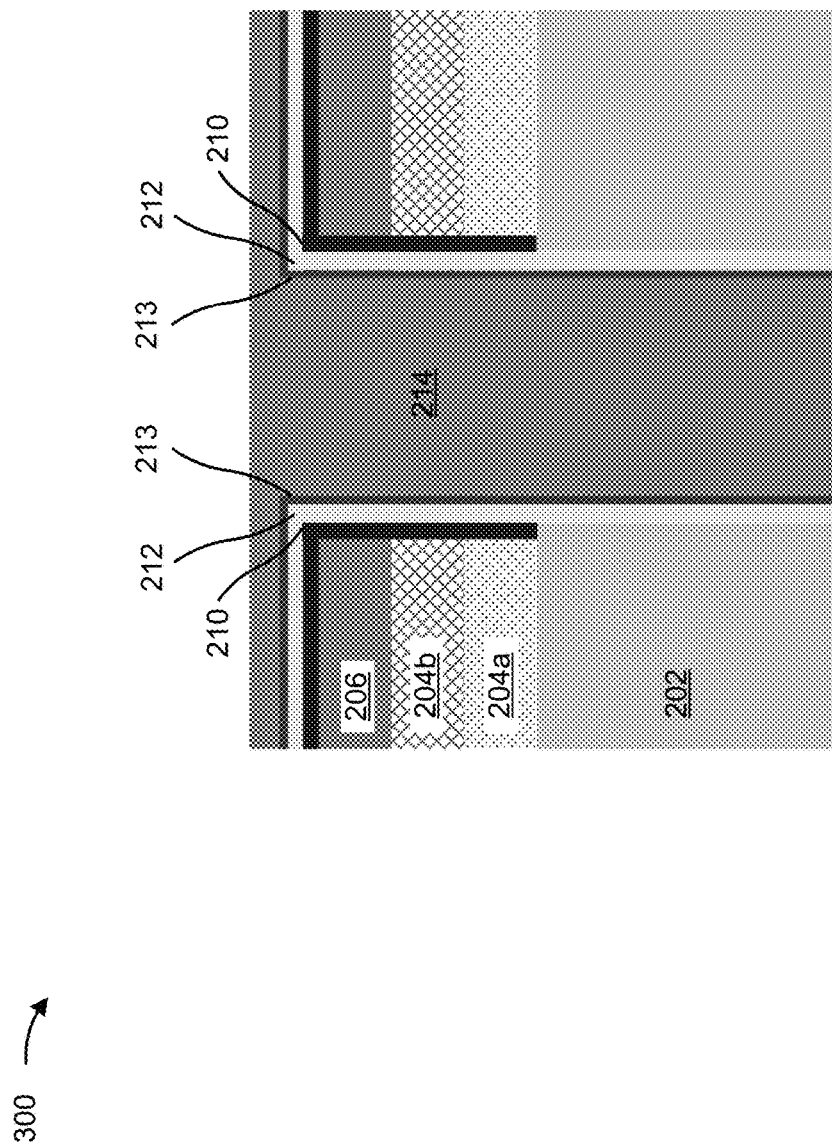

As shown in FIG. 3F, structure 214 may be formed on liner layer 212 within opening 208c and opening 208d. In some implementations, a semiconductor processing tool (e.g., deposition tool 104) may form structure 214 in a manner similar to that described above with respect to FIG. 2I. For example, in some implementations, the semiconductor processing tool deposits barrier layer 213 on liner layer 212 and a seed layer on barrier layer 213, and then performs an electroplating process to provide the conductive material of structure 214 in opening 208, as described above. In some implementations, structure 214 may be a TSV, as shown in semiconductor device 300. Alternatively, in some implementations, structure 214 may be DTC, or another type of structure that extends at least partially through substrate 202 of semiconductor device 300.

Figure 3G:
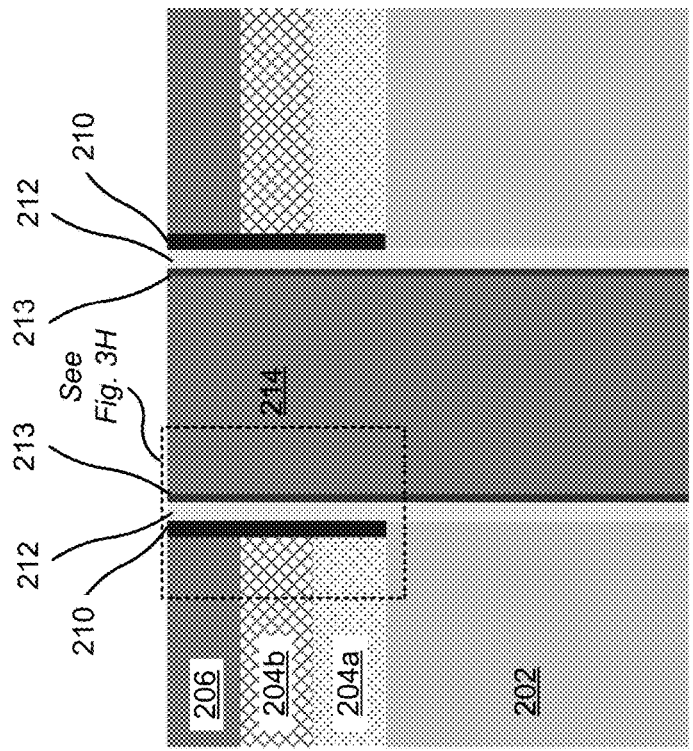

As shown in FIG. 3G, portions of structure 214, liner layer 212, and capping layer 210 may be removed from a top surface of dielectric layer 206 (e.g., such that the top surface of dielectric layer 206 is exposed). In some implementations, the portions of structure 214, liner layer 212, and capping layer 210 may be removed from the top surface of dielectric layer 206 using a planarization technique (e.g., a CMP technique) to remove these portions and flatten the top surface of semiconductor device 200. In some implementations, one or more tools of environment 100, or a tool not shown in environment 100, may perform the planarization technique to remove the portions of structure 214, liner layer 212, and capping layer 210 from the top surface of dielectric layer 206.

As a result of the process described in association with FIGS. 3A-3G, semiconductor device 300 includes the one or more low-κ layers 204 on substrate 202, dielectric layer 206 on the one or more low-κ layers 204, and structure 214 through substrate 202, the one or more low-κ layers 204, and dielectric layer 206. As further shown, semiconductor device 300 includes liner layer 212 between structure 214 and substrate 202, between structure 214 and the one or more low-κ layers 204, and between structure 214 and dielectric layer 206. As shown, semiconductor device 300 also includes capping layer 210 between liner layer 212 and dielectric layer 206 and between liner layer 212 and the one or more low-κ layers 204. Notably, in semiconductor device 300, capping layer 210 is not between liner layer 212 and substrate 202.

Figure 3H:
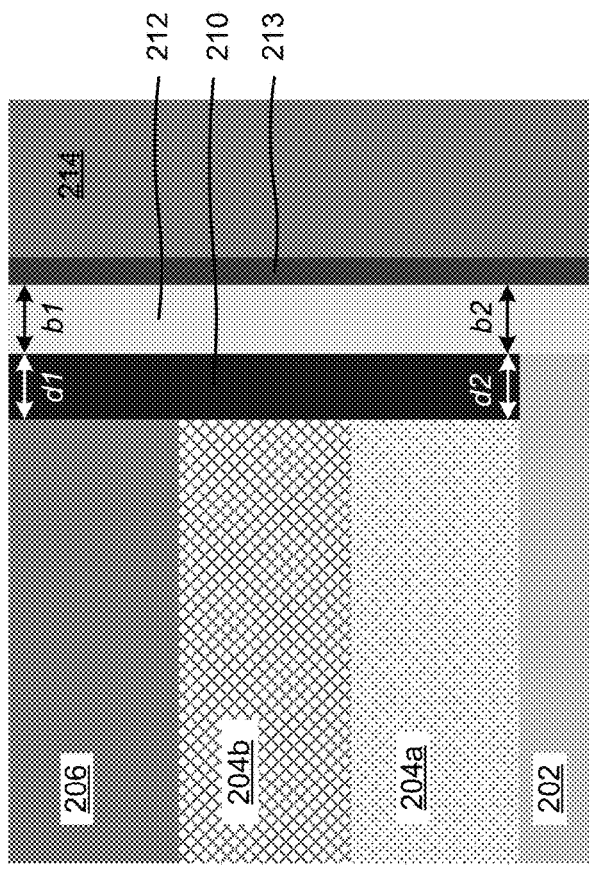

In some implementations, the thickness of capping layer 210 and/or the thickness of liner layer 212 may vary along a depth of opening 208 in semiconductor device 300. FIG. 3H illustrates such variation in the thicknesses of capping layer 210 and liner layer 212 in semiconductor device 300. With reference to FIG. 3H, a thickness d1 of capping layer 210 (e.g., a thickness of capping layer 210 near a top surface of dielectric layer 206) may be approximately 30% to approximately 100% of a thickness d2 of capping layer 210 in semiconductor device 300 (e.g., a thickness of capping layer 210 near a bottom surface of low-κ layer 204a). Similarly, a thickness b1 of liner layer 212 (e.g., a thickness of liner layer 212 near a top surface of dielectric layer 206) may be approximately 30% to approximately 100% of a thickness b2 of liner layer 212 in semiconductor device 300 (e.g., a thickness of liner layer 212 near a bottom surface of low-κ layer 204a)

As indicated above, FIGS. 3A-3H are provided as examples. Other examples may differ from what is described with regard to FIGS. 3A-3H.

Figure 4:
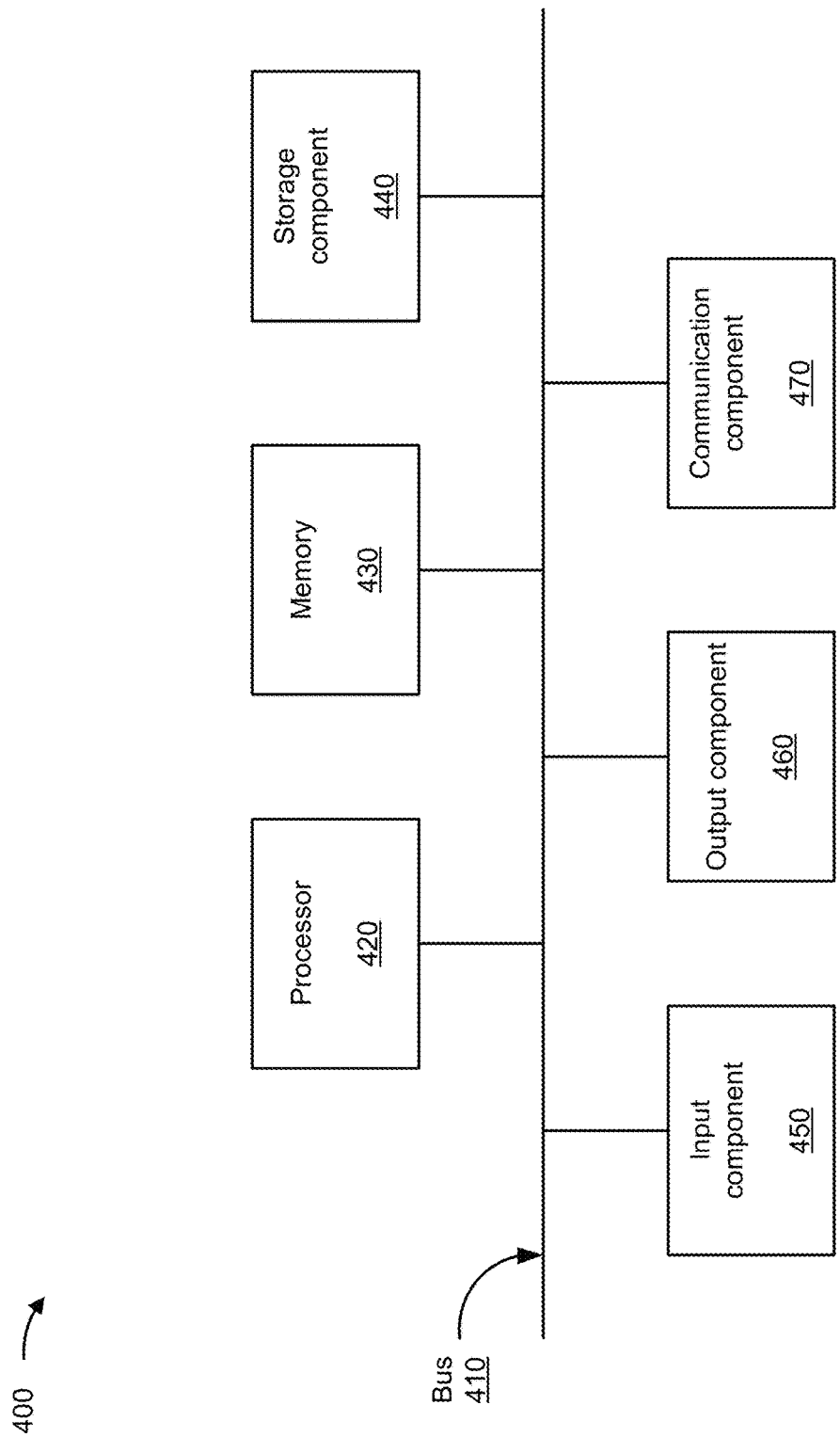
FIG. 4 is a diagram of example components of one or more tools and/or one or more devices of FIG. 1.

FIG. 4 is a diagram of example components of a device 400, which may correspond to pre-clean tool 102, deposition tool 104, annealing tool 106, photoresist tool 108, exposure tool 109, etch tool 110, a planarization tool 111, wafer/die transport device 112, and/or developer tool 113. In some implementations, pre-clean tool 102, deposition tool 104, annealing tool 106, photoresist tool 108, exposure tool 109, etch tool 110, a planarization tool 111, wafer/die transport device 112, and/or developer tool 113 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
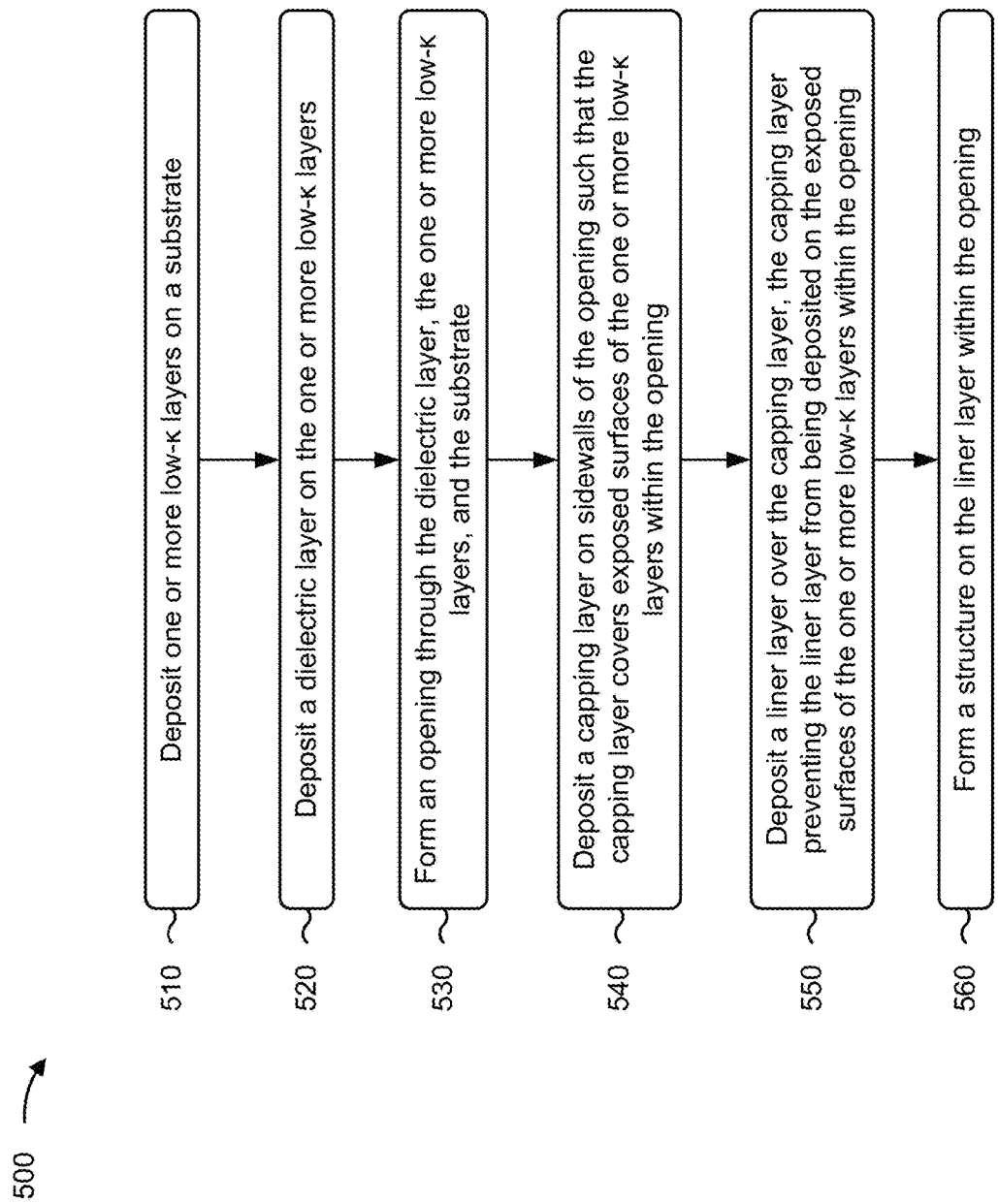
FIGS. 5 and 6 are flowcharts of example processes relating to formation of a structure without damaging a low-κ layer, as described herein.

FIG. 5 is a flowchart of an example process 500 relating to formation of a structure 214 without damaging a low-κ layer 204, as described herein. In some implementations, one or more process blocks of FIG. 5 may be performed by a device (e.g., one or more of the semiconductor processing tools depicted in FIG. 1). In some implementations, one or more process blocks of FIG. 5 may be performed by another device or a group of devices separate from or including the one or more tools depicted in FIG. 1.

As shown in FIG. 5, process 500 may include depositing one or more low-κ layers on a substrate (block 510). For example, the device (e.g., using processor 420, memory 430, storage component 440, input component 450, output component 460, communication component 470, and/or the like) may deposit one or more low-κ layers 204 on a substrate 202, as described above.

As further shown in FIG. 5, process 500 may include depositing a dielectric layer on the one or more low-κ layers (block 520). For example, the device (e.g., using processor 420, memory 430, storage component 440, input component 450, output component 460, communication component 470, and/or the like) may deposit a dielectric layer 206 on the one or more low-κ layers 204, as described above.

As further shown in FIG. 5, process 500 may include forming an opening through the dielectric layer, the one or more low-κ layers, and the substrate (block 530). For example, the device (e.g., using processor 420, memory 430, storage component 440, input component 450, output component 460, communication component 470, and/or the like) may form an opening 208 through the dielectric layer 206, the one or more low-κ layers 204, and the substrate 202, as described above.

As further shown in FIG. 5, process 500 may include depositing a capping layer on sidewalls of the opening such that the capping layer covers exposed surfaces of the one or more low-κ layers within the opening (block 540). For example, the device (e.g., using processor 420, memory 430, storage component 440, input component 450, output component 460, communication component 470, and/or the like) may deposit a capping layer 210 on sidewalls of the opening 208 such that the capping layer 210 covers exposed surfaces of the one or more low-κ layers 204 within the opening 208, as described above.

As further shown in FIG. 5, process 500 may include depositing a liner layer over the capping layer, the capping layer preventing the liner layer from being deposited on the exposed surfaces of the one or more low-κ layers within the opening (block 550). For example, the device (e.g., using processor 420, memory 430, storage component 440, input component 450, output component 460, communication component 470, and/or the like) may deposit a liner layer 212 over the capping layer 210, the capping layer 210 preventing the liner layer 212 from being deposited on the exposed surfaces of the one or more low-κ layers 204 within the opening 208, as described above.

As further shown in FIG. 5, process 500 may include forming a structure on the liner layer within the opening (block 560). For example, the device (e.g., using processor 420, memory 430, storage component 440, input component 450, output component 460, communication component 470, and/or the like) may form a structure 214 on the liner layer 212 within the opening 208, as described above.

Process 500 may include additional implementations, such as any single implementation or any combination of implementations described below and/or in connection with one or more other processes described elsewhere herein.

In a first implementation, the capping layer 210 prevents oxidation of the one or more low-κ layers 204 during the deposition of the liner layer 212.

In a second implementation, alone or in combination with the first implementation, process 500 includes removing portions of the structure 214, the liner layer 212, and the capping layer 210 over a top surface of the dielectric layer 206.

In a third implementation, alone or in combination with one or more of the first and second implementations, the structure 214 is a TSV or a DTC.

In a fourth implementation, alone or in combination with one or more of the first through third implementations, a thickness of the capping layer 210 is in a range from approximately 50 Å to approximately 1000 Å.

In a fifth implementation, alone or in combination with one or more of the first through fourth implementations, a thickness of the capping layer 210 is approximately 10% to approximately 100% of a thickness of the liner layer 212.

In a sixth implementation, alone or in combination with one or more of the first through fifth implementations, a thickness of the capping layer 210 near a top surface of the dielectric layer 206 is approximately 30% to approximately 100% of a thickness of the capping layer 210 near a bottom surface of a bottom low-κ layer 204 of the one or more low-κ layers 204.

In a seventh implementation, alone or in combination with one or more of the first through sixth implementations, the capping layer 210 comprises silicon nitride, silicon carbonitride, silicon carbide, amorphous silicon, or a combination thereof.

In an eighth implementation, alone or in combination with one or more of the first through seventh implementations, an oxygen concentration of the capping layer 210 is less than approximately 5%.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
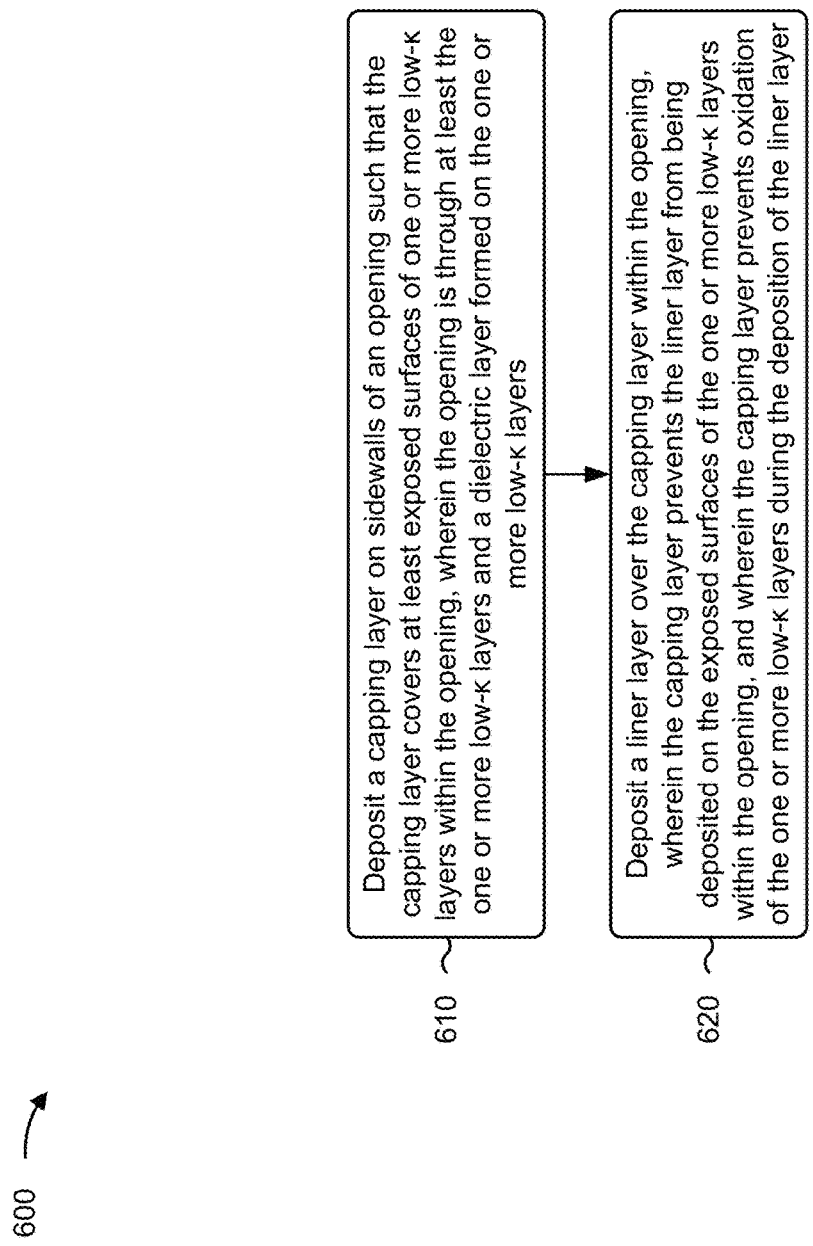

FIG. 6 is a flowchart of an example process 600 relating to formation of a structure 214 without damaging a low-κ layer 204, as described herein. In some implementations, one or more process blocks of FIG. 6 may be performed by a device (e.g., one or more of the semiconductor processing tools depicted in FIG. 1). In some implementations, one or more process blocks of FIG. 6 may be performed by another device or a group of devices separate from or including the one or more tools depicted in FIG. 1.

As shown in FIG. 6, process 600 may include depositing a capping layer on sidewalls of an opening such that the capping layer covers at least exposed surfaces of one or more low-κ layers within the opening, wherein the opening is through at least the one or more low-κ layers and a dielectric layer formed on the one or more low-κ layers (block 610). For example, the device (e.g., using processor 420, memory 430, storage component 440, input component 450, output component 460, communication component 470, and/or the like) may deposit a capping layer 210 on sidewalls of an opening 208 such that the capping layer 210 covers at least exposed surfaces of one or more low-κ layers 204 within the opening 208, as described above. In some implementations, the opening 208 is through at least the one or more low-κ layers 204 and a dielectric layer 206 formed on the one or more low-κ layers 204.

As further shown in FIG. 6, process 600 may include depositing a liner layer over the capping layer within the opening, wherein the capping layer prevents the liner layer from being deposited on the exposed surfaces of the one or more low-κ layers within the opening, and wherein the capping layer prevents oxidation of the one or more low-κ layers during the deposition of the liner layer (block 620). For example, the device (e.g., using processor 420, memory 430, storage component 440, input component 450, output component 460, communication component 470, and/or the like) may deposit a liner layer 212 over the capping layer 210 within the opening 208, as described above. In some implementations, the capping layer 210 prevents the liner layer 212 from being deposited on the exposed surfaces of the one or more low-κ layers 204 within the opening 208. In some implementations, the capping layer 210 prevents oxidation of the one or more low-κ layers 204 during the deposition of the liner layer 212.

Process 600 may include additional implementations, such as any single implementation or any combination of implementations described below and/or in connection with one or more other processes described elsewhere herein.

In a first implementation, the opening 208 is through a substrate 202, and the method further comprises forming a structure 214 on the liner layer 212 within the opening 208.

In a second implementation, alone or in combination with the first implementation, the opening 208 is not through a substrate 202, and the method further comprises extending the opening 208 such that the opening 208 is through the substrate 202, the opening 208 being extended after the depositing of the capping layer 210 and before the depositing of the liner layer 212, and forming a structure 214 on the liner layer 212 within the opening 208.

In a third implementation, alone or in combination with one or more of the first and second implementations, the structure 214 is a TSV or a DTC.

In a fourth implementation, alone or in combination with one or more of the first through third implementations, a thickness of the capping layer 210 is in a range from approximately 50 Å to approximately 1000 Å.

In a fifth implementation, alone or in combination with one or more of the first through fourth implementations, a thickness of the capping layer 210 is approximately 10% to approximately 100% of a thickness of the liner layer 212.

In a sixth implementation, alone or in combination with one or more of the first through fifth implementations, a thickness of the capping layer 210 near a top surface of the dielectric layer 206 is approximately 30% to approximately 100% of a thickness of the capping layer 210 near a bottom surface of a bottom low-κ layer 204 of the one or more low-κ layers 204.

In a seventh implementation, alone or in combination with one or more of the first through sixth implementations, the capping layer 210 comprises silicon nitride, silicon carbonitride, silicon carbide, amorphous silicon, or a combination thereof.

In an eighth implementation, alone or in combination with one or more of the first through seventh implementations, an oxygen concentration of the capping layer 210 is less than approximately 5%.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a capping layer may prevent a liner layer from being deposited directly on exposed surfaces of a set of low-κ layers of a semiconductor device, thereby preventing damage to the set of low-κ layers during the deposition of the liner layer. By preventing the liner layer from being deposited directly on the exposed surfaces of the set of low-κ layers, the capping layer prevents damage to the set of low-κ layers that could otherwise be caused by oxidation during the deposition of the liner layer. Therefore, performance of the semiconductor device is not impacted due to low-κ layer damage that would otherwise be caused by deposition of the liner layer directly on a surface of the low-κ layer, which can significantly improve yield when manufacturing semiconductor devices that include structures such as TSVs, DTCs, or another type of structure that extends through a set of low-κ layers of a semiconductor device.

As described in greater detail above, some implementations described herein provide a semiconductor device and methods of manufacturing a semiconductor device. The semiconductor device may include one or more low-κ layers on a substrate, a dielectric layer on the one or more low-κ layers, and a structure through the substrate, the one or more low-κ layers, and the dielectric layer. The semiconductor device may include a liner layer between the structure and the substrate, between the structure and the one or more low-κ layers, and between the structure and the dielectric layer. The semiconductor device may include a capping layer between the liner layer and the dielectric layer and between the liner layer and the one or more low-κ layers.

A method may include depositing one or more low-κ layers on a substrate, and depositing a dielectric layer on the one or more low-κ layers. The method may include forming an opening through the dielectric layer, the one or more low-κ layers, and the substrate. The method may include depositing a capping layer on sidewalls of the opening such that the capping layer covers exposed surfaces of the one or more low-κ layers within the opening. The method may include depositing a liner layer over the capping layer. The capping layer may prevent the liner layer from being deposited on the exposed surfaces of the one or more low-κ layers within the opening. The method may include forming a structure on the liner layer within the opening.

A method may include depositing a capping layer on sidewalls of an opening such that the capping layer covers at least exposed surfaces of one or more low-κ layers within the opening. Here, the opening may be through at least the one or more low-κ layers and a dielectric layer formed on the one or more low-κ layers. The method may include depositing a liner layer over the capping layer within the opening. The capping layer may prevent the liner layer from being deposited on the exposed surfaces of the one or more low-κ layers within the opening, and may prevent oxidation of the one or more low-κ layers during the deposition of the liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   one or more low dielectric constant (low-κ) layers on a substrate;
   a dielectric layer on the one or more low-κ layers;
   a capping layer deposited directly on a surface of the dielectric layer, a surface of the one or more low-κ layers, and a side surface of the substrate,
      wherein a first thickness of the capping layer near a top surface of the dielectric layer is less than a second thickness of the capping layer near a bottom surface of a bottom low-κ layer of the one or more low-κ layers;
   a liner layer deposited directly on the capping layer,
      wherein the capping layer is between the liner layer and the dielectric layer and between the liner layer and the one or more low-κ layers; and
   a structure deposited directly on a surface of the liner layer,
      wherein the structure is through the substrate, the one or more low-κ layers, and the dielectric layer, and
      wherein the liner layer is between the structure and the substrate, and between the structure and the capping layer.

2. The semiconductor device of claim 1, wherein the capping layer is also between the liner layer and the substrate.

3. The semiconductor device of claim 1, wherein the structure is a through-silicon via or a deep trench capacitor.

4. The semiconductor device of claim 1, wherein a thickness of the capping layer is in a range from approximately 50 Angstroms (Å) to approximately 1000 Å.

5. The semiconductor device of claim 1, wherein a thickness of the capping layer is approximately 10% to approximately 100% of a thickness of the liner layer.

6. The semiconductor device of claim 1, wherein the capping layer comprises at least one of silicon nitride, silicon carbonitride, silicon carbide, or amorphous silicon.

7. The semiconductor device of claim 1, wherein an oxygen concentration of the capping layer is less than approximately 5%.

8. The semiconductor device of claim 1, wherein the capping layer is a single layer.

9. A method, comprising:
   depositing one or more low dielectric constant (low-κ) layers on a substrate;
   depositing a dielectric layer on the one or more low-κ layers;
   forming an opening through the dielectric layer, the one or more low-κ layers, and the substrate;
   depositing a capping layer on sidewalls of the opening such that the capping layer is directly deposited on exposed surfaces of the one or more low-κ layers and exposed side surfaces of the substrate within the opening;
   depositing a liner layer directly on the capping layer, the capping layer preventing the liner layer from being deposited on the exposed surfaces of the one or more low-κ layers within the opening; and
   forming a structure directly on the liner layer within the opening.

10. The method of claim 9, wherein the capping layer prevents oxidation of the one or more low-κ layers during the deposition of the liner layer.

11. The method of claim 9, further comprising removing portions of the structure, the liner layer, and the capping layer over a top surface of the dielectric layer.

12. The method of claim 9, wherein the structure is a through-silicon via or a deep trench capacitor.

13. The method of claim 9, wherein a thickness of the capping layer is in a range from approximately 50 Angstroms (Å) to approximately 1000 Å.

14. The method of claim 9, wherein a thickness of the capping layer is approximately 10% to approximately 100% of a thickness of the liner layer.

15. The method of claim 9, wherein a thickness of the capping layer near a top surface of the dielectric layer is approximately 30% to approximately 100% of a thickness of the capping layer near a bottom surface of a bottom low-κ layer of the one or more low-κ layers.

16. The method of claim 9, wherein the capping layer comprises silicon nitride, silicon carbonitride, silicon carbide, amorphous silicon, or a combination thereof.

17. The method of claim 9, wherein an oxygen concentration of the capping layer is less than approximately 5%.

18. A method, comprising:
depositing a capping layer on sidewalls of an opening such that the capping layer is directly deposited on at least exposed surfaces of one or more low dielectric constant (low-κ) layers and exposed side surfaces of a substrate within the opening,
   wherein the opening is through at least the one or more low-κ layers, a dielectric layer formed on the one or more low-κ layers, and the substrate; and
depositing a liner layer directly on the capping layer within the opening,
   wherein the capping layer prevents the liner layer from being deposited on the exposed surfaces of the one or more low-κ layers within the opening, and
   wherein the capping layer prevents oxidation of the one or more low-κ layers during the deposition of the liner layer.

19. The method of claim 18, further comprising:
forming a structure on the liner layer within the opening.

20. The method of claim 18, further comprising:
extending the opening such that the opening is through the substrate; and
forming a structure on the liner layer within the opening.

* * * * *